United States Patent
Abe et al.

(10) Patent No.: US 9,761,673 B2
(45) Date of Patent: Sep. 12, 2017

(54) AMORPHOUS P-TYPE OXIDE FOR A SEMICONDUCTOR DEVICE

(75) Inventors: Yukiko Abe, Kanagawa (JP); Naoyuki Ueda, Kanagawa (JP); Yuki Nakamura, Tokyo (JP); Shinji Matsumoto, Tokyo (JP); Yuji Sone, Kanagawa (JP); Mikiko Takada, Kanagawa (JP); Ryoichi Saotome, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 244 days.

(21) Appl. No.: 14/007,705

(22) PCT Filed: Mar. 28, 2012

(86) PCT No.: PCT/JP2012/059131
§ 371 (c)(1),
(2), (4) Date: Sep. 26, 2013

(87) PCT Pub. No.: WO2012/133915
PCT Pub. Date: Oct. 4, 2012

(65) Prior Publication Data
US 2014/0009514 A1  Jan. 9, 2014

(30) Foreign Application Priority Data

Mar. 31, 2011 (JP) ................... 2011-080171
Mar. 1, 2012 (JP) ................... 2012-045666

(51) Int. Cl.
*C01G 3/02* (2006.01)
*C01F 11/02* (2006.01)
(Continued)

(52) U.S. Cl.
CPC .............. *H01L 29/242* (2013.01); *C01F 5/06* (2013.01); *C01F 11/04* (2013.01); *C01G 3/02* (2013.01);
(Continued)

(58) Field of Classification Search
CPC ........... H01L 21/02579; H01L 27/2409; H01L 29/242; H01L 29/861; H01L 29/7869;
(Continued)

(56) References Cited

U.S. PATENT DOCUMENTS 6,294,274 B1 * 9/2001 Kawazoe ................ C03C 17/23
320/101
7,087,526 B1    8/2006 Zhuang et al.
(Continued)

FOREIGN PATENT DOCUMENTS

EP     1258928 A1    11/2002
JP     11-278834     10/1999
(Continued)

OTHER PUBLICATIONS

Taiwanese official action dated Nov. 21, 2013 and English translation in corresponding Taiwanese patent application No. 10 11 11134.
(Continued)

*Primary Examiner* — Cheung Lee
*Assistant Examiner* — Stephen C Smith
(74) *Attorney, Agent, or Firm* — Cooper & Dunham LLP

(57) ABSTRACT

A p-type oxide which is amorphous and is represented by the following compositional formula: $xAO \cdot yCu_2O$ where x denotes a proportion by mole of AO and y denotes a proportion by mole of $Cu_2O$ and x and y satisfy the following expressions: $0 \leq x < 100$ and $x+y=100$, and A is any one of Mg, Ca, Sr and Ba, or a mixture containing at least one selected from the group consisting of Mg, Ca, Sr and Ba.

4 Claims, 20 Drawing Sheets

(51) Int. Cl.
*H01L 29/24* (2006.01)
*H01L 29/786* (2006.01)
*C01F 5/06* (2006.01)
*C01F 11/04* (2006.01)
*G09G 3/32* (2016.01)
*H01L 29/04* (2006.01)
*H01L 27/32* (2006.01)

(52) U.S. Cl.
CPC ............... *G09G 3/32* (2013.01); *H01L 29/04* (2013.01); *H01L 29/78693* (2013.01); *C01P 2002/02* (2013.01); *H01L 27/3244* (2013.01)

(58) Field of Classification Search
CPC ........... H01L 29/78693; H01L 31/0336; H01L 31/03365; H01L 45/146; H01L 2251/303; H01L 29/04; C01F 11/04; C01F 5/06; C01G 3/02; C01P 2002/02; G09G 3/32
See application file for complete search history.

(56) References Cited

U.S. PATENT DOCUMENTS

| | | | |
|---|---|---|---|
| 7,329,915 B2* | 2/2008 | Herman | ............... H01L 29/242 257/288 |
| 7,816,674 B2 | 10/2010 | Kato et al. | |
| 2003/0132449 A1 | 7/2003 | Hosono et al. | |
| 2005/0133917 A1 | 6/2005 | Hoffman et al. | |
| 2006/0084278 A1 | 4/2006 | Winter et al. | |
| 2007/0054042 A1 | 3/2007 | Zhuang et al. | |
| 2007/0126042 A1* | 6/2007 | Kijima | ............... H01L 27/11502 257/295 |
| 2009/0230386 A1 | 9/2009 | Yamamoto et al. | |
| 2010/0219405 A1 | 9/2010 | Sagisaka et al. | |
| 2010/0308297 A1* | 12/2010 | Kim | .................... H01L 27/1021 257/5 |
| 2011/0040107 A1 | 2/2011 | Goto et al. | |
| 2011/0128275 A1 | 6/2011 | Ueda et al. | |
| 2011/0215306 A1 | 9/2011 | Kato et al. | |

FOREIGN PATENT DOCUMENTS

| | | |
|---|---|---|
| JP | 2000-150166 | 5/2000 |
| JP | 2000-150861 | 5/2000 |
| JP | 2000-227769 | 8/2000 |
| JP | 2000-228516 | 8/2000 |
| JP | 2001-007365 | 1/2001 |
| JP | 2005-183984 | 7/2005 |
| JP | 2007-042771 | 2/2007 |
| JP | 2007-073936 | 3/2007 |
| JP | 2009-224136 | 10/2009 |
| TW | 201010084 | 3/2010 |
| WO | WO 2004/085305 A2 | 10/2004 |

OTHER PUBLICATIONS

International Search Report Issued for counterpart International Patent Application No. PCT/JP2012/059131 dated Jul. 10, 2012.

J. Bloem, Discussion of some optical and electrical properties of $Cu_2O$, Philips Research Reports, vol. 13, 1958, pp. 167-193.

H. Kawazoe, et al., P-type electrical conduction in transparent thin films of $CuAlO_2$, Nature, vol. 389, 1997, pp. 939-942.

H. Yanagi, et al., Bipolarity in electrical conduction of transparent oxide semiconductor $CuInO_2$ with delafossite structure, Applied Physics Letters, vol. 78, 2001, pp. 1583-1585.

A. Kudo, three others, $SrCu_2O_2$: A p-type conductive oxide with wide band gap, Applied Physics Letters, vol. 73, 1998, pp. 220-222.

E. Fortunato, eight others, Thin-film transistors based on p-type $Cu_2O$ thin films produced at room temperature, Applied Physics Letters, vol. 96, 2010, pp. 192102.

K. Matsuzaki, five others, Epitaxial growth of high mobility $Cu_2O$ thin films and application to p-channel thin film transistor, Applied Physics Letters, vol. 93, 2008, pp. 202107.

European Search Report dated Aug. 5, 2014 in corresponding European patent application No. 12 76 4443.3.

* cited by examiner

AMORPHOUS P-TYPE OXIDE FOR A SEMICONDUCTOR DEVICE

TECHNICAL FIELD

The present invention relates to a p-type oxide, a p-type oxide-producing composition, a method for producing the p-type oxide, a semiconductor device, a display device, an image display apparatus, and a system. The present invention further specifically relates to a p-type oxide exhibiting p-type electrical conductivity, a p-type oxide-producing composition for producing the p-type oxide, a method for producing the p-type oxide, a semiconductor device using the p-type oxide in an active layer, a display device having the semiconductor device, an image display apparatus using the display device, and a system including the image display apparatus.

BACKGROUND ART

A development of $InGaZnO_4$ (a-IGZO) thin film transistors (TFT) which, in an amorphous state, have higher mobility than a-Si has promoted a research and development in an effort to make oxide semiconductors practicable all over the world. However, almost all of these oxide semiconductors have been an n-type oxide semiconductor which electrons serve as a carrier.

If a p-type oxide semiconductor which properties are comparable with that of the n-type oxide semiconductor becomes available, the p-type oxide semiconductor can be combined with the n-type oxide semiconductor to form a p-n junction which results in, for example, a diode, an optical sensor, a solar cell, a LED, and a bipolar transistor. The oxide semiconductor can be made into a wide bandgap semiconductor, which allows a device including the semiconductor to be transparent.

In an active matrix organic EL display, a basic driving circuit is a 2T1C circuit as shown in FIG. 7. In this case, a driving transistor (field effect transistor 20) which is an n-type transistor results in a so-called source follower connection. Thus, a time-dependent change (especially voltage rise) of organic EL device properties causes an operating point of the driving transistor to move to another operating point at different gate voltage, which shortens a half-life of the display. This is the reason why an AM-OLED (active matrix organic EL display) has not been practicable yet which uses a-IGZO TFT having high mobility as a backplane, and at present, a p-type LTPS-TFT (low temperature polysilicon thin film transistor) is solely employed. As a result, a high-performance p-type oxide semiconductor s again strongly desired.

It has been known from 1950s that a $Cu_2O$ crystal exhibits p-type electrical conductivity (see, for example, NPL 1). This crystal is based on an O—Cu—O dumbbell structure, and, in the structure, a hybrid orbital of Cu 3d and O 2p constitutes the top of a valence band. An oxygen-excess nonstoichiometry results in a hole in the foregoing valence band, which leads to p-type conductivity.

Examples of the crystal based on the dumbbell structure include a delafossite crystal represented by the following formula: $CuMO_2$ (where M=Al, Ga, or In) and a $SrCu_2O_2$ crystal. Oxides thereof should have high crystallinity in order to exhibit p-type electrical conductivity. Thus, it is only $CuAlO_2$, $CuInO_2$, and $SrCu_2O_2$ that is actually reported to exhibit p-type electrical conductivity (see, for example, NPLs 2 to 4).

One reason why it is difficult to exhibit p-type electrical conductivity is that the valence of Cu and the amount of oxygen cannot be easily controlled. A $Cu^{2+}$-containing crystal phase such as $CuO$, $SrCuO_2$, and $SrCu_2O_3$ is often contaminated in an effort to form a single phase film composed of a $Cu^+$-containing oxide which has excellent crystallinity. Such contaminated film cannot exhibit excellent p-type electrical conductivity and cannot be easily controlled in properties. This means that properties such as carrier concentration and carrier mobility cannot be optimized when these p-type oxide materials are used for an active layer in a semiconductor device.

In addition, a delafossite oxide containing monovalent Cu or Ag has been proposed (see PTL 1). However, the above proposed technology requires a heat treatment at high temperature of 500° C. or more, which is not practical.

A p-type electrical conductive thin film containing crystalline $SrCu_2O_2$ has been proposed (see PTL 2). In the above proposed technology, the thin film can be formed at relatively low temperature of 300° C. However, the thin film can only exhibit electrical conductivity of up to $4.8\times10^{-2}$ $Scm^{-1}$, which is insufficient. The electrical conductivity also cannot be appropriately controlled.

That is, the above proposed technologies are neither capable of producing the p-type oxide in a practical manner nor capable of resulting in the p-oxide material exhibiting appropriately controlled and sufficient electrical conductivity.

A TFT has been proposed using, as an active layer, a p-type oxide material which has a delafossite crystal structure containing monovalent Cu or Ag (see PTL 3).

However, the above proposed technology has not disclosed sufficient information with regard to, for example, material properties of an active layer, a method for producing the active layer, and transistor properties.

A TFT has also been proposed using, as an active layer, a $Cu_2O$ crystal (see NPLs 5 and 6). However, the above proposed technologies could not achieve a practically usable level with regard to, for example, the electron field effect mobility and the on-off ratio of the TFT because the active layer could not be sufficiently controlled in properties.

That is, the above proposed technologies neither capable of easily controlling various properties such as carrier concentration of the p-type oxide material nor achieving suitable properties for being used in a device.

In conclusion, no practical and useful p-type oxide material has been found.

Accordingly, there is still a need to provide a p-type oxide which properties are comparable with that of n-type oxides, a p-type oxide-producing composition for producing the p-type oxide, a method for producing the p-type oxide, a semiconductor device using the p-type oxide in an active layer, a display device having the semiconductor device, an image display apparatus using the display device, and a system including the image display apparatus.

CITATION LIST

Patent Literature

PTL 1: Japanese Patent Application Laid-Open (JP-A) No. 11-278834
PTL 2: JP-A No. 2000-150861
PTL 3: JP-A No. 2005-183984

Non-Patent Literature

NPL 1: J. Bloem, Discussion of some optical and electrical properties of $Cu_2O$, Philips Research Reports, VOL. 13, 1958, pp. 167-193

NPL 2: H. Kawazoe, et al., P-type electrical conduction in transparent thin films of $CuAlO_2$, Nature, VOL. 389, 1997, pp. 939-942

NPL 3: H. Yanagi, et al., Bipolarity in electrical conduction of transparent oxide semiconductor $CuInO_2$ with delafossite structure, Applied Physics Letters, VOL. 78, 2001. pp. 1583-1585

NPL 4: A. Kudo, three others, $SrCu_2O_2$: A p-type conductive oxide with wide band gap, Applied Physics Letters, VOL. 73, 1998, pp. 220-222

NPL 5: E. Fortunato, eight others, Thin-film transistors based on p-type $Cu_2O$ thin films produced at room temperature, Applied Physics Letters, VOL. 96, 2010, pp. 192102

NPL 6: K. Matsuzaki, five others, Epitaxial growth of high mobility $Cu_2O$ thin films and application to p-channel thin film transistor, Applied Physics Letters, VOL. 93, 2008, pp. 202107

SUMMARY OF INVENTION

Technical Problem

The present invention aims to solve the above existing problems and achieve the following object. Specifically, an object of the present invention is to provide a novel p-type oxide capable of exhibiting excellent property, that is sufficient electrical conductivity, being produced at relatively low-temperature and under practical conditions, and being controlled in electrical conductivity by adjusting its composition ratio; a p-type oxide-producing composition for producing the p-type oxide; a method for producing the p-type oxide; a semiconductor device using the p-type oxide in an active layer; a display device having the semiconductor device, an image display apparatus using the display device; and a system including the image display apparatus.

Solution to Problem

Means for solving the above existing problems are as follows.

<1> A p-type oxide,
wherein the p-type oxide is amorphous and is represented by the following compositional formula: $xAO.yCu_2O$ where x denotes a proportion by mole of AO and y denotes a proportion by mole of $Cu_2O$ and x and y satisfy the following expressions: $0 \leq x < 100$ and $x+y=100$, and A is any one of Mg, Ca, Sr and Ba, or a mixture containing at least one selected from the group consisting of Mg, Ca, Sr and Ba.

<2> A p-type oxide-producing composition including:
a solvent;
a Cu-containing compound; and
a compound containing at least one selected from the group consisting of Mg, Ca, Sr and Ba,
wherein the p-type oxide-producing composition is designed to produce the p-type oxide according to <1>.

<3> A method for producing the p-type oxide according to <1> including:
applying a composition onto a support; and
heat treating the composition after the applying,
wherein the composition includes a solvent, a Cu-containing compound, and a compound containing at least one selected from the group consisting of Mg, Ca, Sr and Ba.

<4> A semiconductor device including:
an active layer,
wherein the active layer includes the p-type oxide according to <1>.

<5> The semiconductor device according to <4>, further including:
a first electrode: and
a second electrode,
wherein the semiconductor device is a diode where the active layer is formed between the first electrode and the second electrode.

<6> The semiconductor device according to <4>, further including:
a gate electrode configured to apply gate voltage;
a source electrode and a drain electrode which are configured to extract electric current; and
a gate insulating layer,
wherein the semiconductor device is a field effect transistor where the active layer is formed between the source electrode and the drain electrode, and the gate insulating layer is formed between the gate electrode and the active layer.

<7> A display device including:
a light control device configured to control output of light based on a driving signal; and
a driving circuit containing the semiconductor device according to <4> and configured to drive the light control device.

<8> The display device according to <7>, wherein the light control device includes an organic electroluminescence device or an electrochromic device.

<9> The display device according to <7>, wherein the light control device includes a liquid crystal device, an electrophoretic device or an electrowetting device.

<10> An image display apparatus including:
a plurality of the display devices according to <7> which are arranged in a matrix form and each contain a field effect transistor;
a plurality of wirings configured to individually apply gate voltage and signal voltage to the field effect transistors of the display devices; and
a display control apparatus configured to individually control the gate voltage and the signal voltage in the field effect transistors via the wirings based on image data,
wherein the image display apparatus is configured to display an image based on the image data.

<11> A system including:
the image display apparatus according to <10>; and
an image data generation apparatus configured to generate image data based on image information to be displayed, and output the image data to the image display apparatus.

Advantageous Effects of Invention

The present invention can solve the above existing problems and provide a novel p-type oxide capable of exhibiting excellent property, that is sufficient electrical conductivity, being produced at relatively low-temperature and under practical conditions, and being controlled in electrical conductivity by adjusting its composition ratio; a p-type oxide-producing composition for producing the p-type oxide; a method for producing the p-type oxide; a semiconductor device using the p-type oxide in an active layer; a display device having the semiconductor device, an so image display apparatus using the display device; and a system including the image display apparatus.

Figure 1:
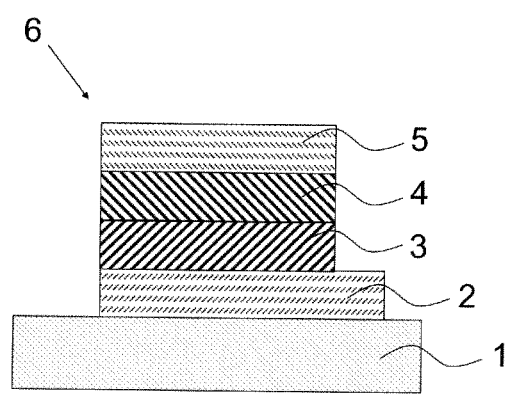
FIG. 1 is a schematic structural view of one exemplary diode.

DESCRIPTION OF EMBODIMENTS (p-Type Oxide, p-Type Oxide-Producing Composition, and Method for Producing p-Type Oxide)

<p-Type Oxide>

A p-type oxide of the present invention is amorphous and is represented by the compositional formula: $xAO \cdot yCu_2O$ where x denotes a proportion by mole of AO and y denotes a proportion by mole of $Cu_2O$ and satisfy the following expressions: $0 \leq x < 100$ and $x+y=100$, and A is any one of Mg, Ca, Sr and Ba, or a mixture containing at least one selected from the group consisting of Mg, Ca, Sr and Ba.

The p-type oxide can exhibit p-type electrical conductivity in which holes serve as a carrier despite of being amorphous. In addition, the p-type oxide can be obtained which has suitable properties depending on the intended purpose by continuously varying its composition ratio (x, y) to widely control electrical conductivity of the oxide, which is due to its amorphous structure.

Conventionally, it has been believed that a monovalent Cu (or Ag) oxide of which valence band is composed of a hybrid orbital of Cu 3d and O 2p has a strong orbital anisotropy, and thus must be crystalline in order to exhibit p-type conductivity. An n-type oxide semiconductor is very different from the above monovalent Cu (or Ag) oxide in this point because a conduction band of the n-type oxide is composed of an isotropic s-orbital in heavy metal. However, the inventors have been found that the Cu oxide may exhibit p-type conductivity despite of being amorphous. In the composition range, only $SrCu_2O_2$ and $BaCu_2O_2$ have been reported as crystal phase. These crystals are difficult to control in conductivity.

That is, the p-type oxide of the present invention can widely vary in composition, which is different from the p-type oxide containing crystalline Cu. In particular, it is very advantageous that the density of state of a d-p hybrid band and electrical conductivity can be widely controlled because the chemical species and amount of A (Mg, Ca, Sr, and/or Ba) which is a counter cation of Cu can be freely selected. Additionally, conventional Cu-containing p-type oxides are crystalline, while the p-type oxide of the present invention is amorphous. Therefore, the p-type oxide of the present invention is advantageous in that unevenness in properties due to an uneven crystallinity will not occur, and whereby a uniform film can be obtained therefrom.

Note that the p-type oxide essentially consists of an amorphous oxide represented by the following compositional formula: $xAO \cdot yCu_2O$ where x denotes a proportion by mole of AO and y denotes a proportion by mole of $Cu_2O$ and satisfy the following expressions: $0 \leq x < 100$ and $x+y=100$, but an only small amount of fine crystal particles may be present in the p-type oxide, so long as they have almost no effect on semiconductor properties. The phrase "only small amount" means as used herein the amount which does not cause a percolation of the fine crystal particles, which is about 15% by volume or less.

The A includes Mg, Ca, Sr and/or Ba. That is, the A may be any one of Mg, Ca, Sr and Ba, or a mixture of any two to four of Mg, Ca, Sr and Ba.

The A in the p-type oxide may be doped with, for example, Rb or Cs.

The electrical property of the p-type oxide depends on the chemical species of the A and the molar ratio of A to Cu (that is, values of x and y). An oxide film of the present invention can be used for various semiconductor devices, but a property which semiconductors in the devices require (that is, resistivity) generally varies depending on the type and property of the semiconductor devices. Accordingly, the chemical species of the A and the molar ratio of A to Cu (that is, values of x and y) may be appropriately selected depending on the intended purpose, provided that when the volume resistivity of the oxide film is more than $10^8$ Ωcm, an ohmic contact cannot easily formed upon connection with an electrode, which cannot practically preferred in some cases. In order for the volume resistivity to be $10^8$ Ωcm or less, in the case where the compositional formula: $xAO.yCu_2O$ is $xMgO.yCu_2O$, x is preferably less than 80. In the case where the compositional formula: $xAO.yCu_2O$ is $xCaO.yCu_2O$, x is preferably less than 85. In the case where the compositional formula: $xAO.yCu_2O$ is $xSrO.yCu_2O$, x is preferably less than 85. In the case where the compositional formula: $xAO.yCu_2O$ is $xBaO.yCu_2O$, x is preferably less than 75.

The shape of the p-type oxide is not particularly limited and may be appropriately selected depending on the intended purpose. For example, the p-type oxide may be film or bulk (particle).

The p-type oxide is useful as a p-type active layer for a semiconductor device such as a p-n junction diode, a PIN photodiode, a field effect transistor, a light-emitting device, and a photoelectric transducer.

A method for producing the p-type oxide is preferably a method for producing a p-type oxide of the present invention using a p-type oxide-producing composition of the present invention described below.

Other methods for producing the p-type oxide are not particularly limited and may be appropriately selected depending on the intended purpose. Examples thereof include a sputtering method, a pulsed laser deposition (PLD) method, a CVD method, and an ALD method.

<p-Type Oxide-Producing Composition>

The p-type oxide-producing composition contains at least a solvent, a Cu-containing compound, and a compound containing Mg, Ca, Sr and/or Ba; and, if necessary, further contains other components.

The p-type oxide-producing composition is a composition used for producing the p-type oxide of the present invention.

—Solvent—

The solvent is not particularly limited and may be appropriately selected depending on the intended purpose. Examples thereof include toluene, xylene, 2-ethyl hexanoic acid, acetylacetone, ethylene glycol, and 2-methoxy ethanol.

Solvents such as diethylene glycol and dimethylformamide may be used in order to impart desired properties such as viscoelasticity and dielectricity to the p-type oxide-producing composition.

These may be used alone or in combination.

The amount of the solvent in the p-type oxide-producing composition is not particularly limited and may be appropriately selected depending on the intended purpose.

—Cu-Containing Compound—

Copper in the p-type oxide is monovalent, but Cu in the Cu-containing compound is not limited thereto. The Cu-containing compound may be appropriately selected depending on the intended purpose. Examples thereof include organic copper carboxylates such as copper(II) neodecanoate; organic copper complexes such as copper(II) phthalocyanine and copper(I) phenylacetylide; copper alkoxides such as copper(II) diethoxide; and inorganic copper salts such as copper(II) sulfate and copper(I) acetate.

Among these, in the case where the p-type oxide-producing composition is produced in nonpolar solvents, organic copper carboxylates are preferable and copper(II) neodecanoate is more preferable in terms of solubility. In the case where the p-type oxide-producing composition is produced in polar solvents, inorganic copper salts are preferable and copper(II) sulfate is more preferable in terms of solubility.

The amount of the Cu-containing compound contained in the p-type oxide-producing composition is not particularly limited and may be appropriately selected depending on the intended purpose.

—Compound Containing Mg, Ca, Sr and/or Ba—

The compound containing Mg, Ca, Sr and/or Ba is not particularly limited and may be appropriately selected depending on the intended purpose. Examples thereof include organic carboxylates, organic metal complexes, metal alkoxides, and inorganic salts containing Mg, Ca, Sr and/or Ba.

Among these, in the case where the p-type oxide-producing composition is produced in nonpolar solvents, organic carboxylates are preferable; and magnesium 2-ethylhexanoate, calcium 2-ethylhexanoate, strontium 2-ethylhexanoate, and barium 2-ethylhexanoate are more preferable in terms of solubility. In the case where the p-type oxide-producing composition is produced in polar solvents, inorganic salts are preferable; and magnesium nitrate, calcium nitrate, strontium chloride, and barium chloride are more preferable in terms of solubility.

The p-type oxide-producing composition of the present invention is suitable as a raw solution used for producing the p-type oxide which exhibits excellent electrical conductivity. It is characterized that Cu in the p-type oxide is monovalent, but Cu in the Cu-containing compound contained in the p-type oxide-producing composition is not limited thereto and preferably divalent. When Cu in the Cu-containing compound is divalent, Cu in the p-type oxide-producing composition is also divalent, a ratio of the number of Cu atoms to the number of oxygen atoms therefore is 1:1 in the p-type oxide-producing composition. However, Cu in the p-type oxide ($xAO.yCu_2O$) produced therefrom is monovalent, thus a ratio of the number of Cu atoms to the number of oxygen atoms is 2:1 in the p-type oxide. The p-type oxide-producing composition has excess oxygen atoms relative to Cu atoms in producing the p-type oxide. Such p-type oxide-producing composition results in the p-type oxide which has large amount of oxygen to thereby suppress carrier compensation due to an oxygen defect. Therefore, the p-type oxide with high concentration of holes and exhibits excellent p-type electrical conductivity can be obtained.

In the p-type oxide-producing composition, the composition of metal elements and the mixing ratio of solvents can be widely varied, and thus can be appropriately adjusted depending on methods for producing the p-type oxide and the intended uses described below.

<Method for Producing p-Type Oxide>

A method for producing the p-type oxide of the present invention includes at least an application step and a heat treatment step; and, if necessary, further includes other steps.

—Application Step—

The application step is not particularly limited and may be appropriately selected depending on the intended purpose, so long as it is a step for applying a composition onto a support.

The composition is the p-type oxide-producing composition of the present invention.

The support is not particularly limited and may be appropriately selected depending on the intended purpose. Example thereof includes a glass base.

A method for applying the composition is not particularly limited and may be appropriately selected depending on the intended purpose. For example, existing methods can be utilized such as a spin coating method, an inkjet printing method, a slit coating method, a nozzle printing method, a gravure printing method, and a micro-contact printing method. Among these, the spin coating method is preferable in the case where a film having a uniform thickness is desired to be easily produced over a large area. Using appropriate printing conditions and printing methods such as the inkjet printing method and the micro-contact printing method allows for the composition to be printed in a desired shape without needing a subsequent patterning step.

—Heat Treatment Step—

The heat treatment step is not particularly limited and may be appropriately selected depending on the intended purpose, so long as it is a step of performing heat treatment after the application step, and thereby being capable of drying the solvent contained in the composition, decomposing the Cu-containing compound, decomposing the compound containing Mg, Ca, Sr and/or Ba, and producing the p-type oxide.

In the heat treatment step, the drying the solvent contained in so the composition (hereinafter may referred to as "drying step") is preferably performed at different temperature from the decomposing the Cu-containing compound, decomposing the compound containing Mg, Ca, Sr and/or Ba, and producing the p-type oxide (hereinafter may referred to as "decomposition and production step"). That is, it is preferable that the temperature is raised after drying the solvent, and then the Cu-containing compound is decomposed, the compound containing Mg, Ca, Sr and/or Ba is decomposed, and the p-type oxide is produced.

The temperature of the drying step is not particularly limited and may be appropriately selected depending on the solvent contained. It is, for example, 80° C. to 180° C. A vacuum oven may effectively used for lowering the temperature at the drying step.

The period of the drying step is not particularly limited and may be appropriately selected depending on the intended purpose. It is, for example, 10 min to 1 hr.

The temperature of the decomposition and production step is not particularly limited and may be appropriately selected depending on the intended purpose. It is, for example, 200° C. to 400° C.

The period of the decomposition and production step is not particularly limited and may be appropriately selected depending on the intended purpose. It is, for example, 1 hr to 5 hr.

In the heat treatment step, the decomposition and production step may be performed simultaneously or divided into multiple steps.

A method for performing the heat treatment step is not particularly limited and may be appropriately selected depending on the intended purpose. For example, the support may be heated.

An atmosphere under which the heat treatment step is performed is not particularly limited and may be appropriately selected depending on the intended purpose, but is preferably oxygen atmosphere. Performing the heat treatment under the oxygen atmosphere allows a decomposition product to be rapidly discharged from a system and oxygen defects of the resultant p-type oxide to be decreased.

Upon the heat treatment step, exposing the composition which has been dried to ultraviolet radiation having a wavelength of 400 nm or less is effective for promoting reactions in the decomposition and production step. The exposing to ultraviolet radiation having a wavelength of 400 nm or less allows for the p-type oxide to be produced more efficiently because the ultraviolet radiation breaks a chemical bond between organic matters contained in the composition and thereby decomposing the organic matter.

The ultraviolet radiation having a wavelength of 400 nm or less is not particularly limited and may be appropriately selected depending on the intended purpose. Example thereof includes ultraviolet radiation having a wavelength of 222 nm irradiated with an excimer lamp.

In stead of or in addition to the ultraviolet radiation, an ozone treatment may be preferably performed. A production of the oxide is promoted by treating, with ozone, the composition which has been dried.

In the method for producing the p-type oxide of the present invention, the p-type oxide is produced through a solution process. Therefore, the p-type oxide can be produced easier, in larger quantities, and at a lower cost than the p-type oxide produced through a vacuum process.

In addition, the method for producing the p-type oxide of the present invention can produce the p-type oxide which exhibits excellent p-type electrical conductivity. In the method for producing the p-type oxide of the present invention, the composition used therefor preferably contains the Cu-containing compound in which Cu is divalent. In this case, Cu in the composition is divalent, a ratio of the number of Cu atoms to the number of oxygen atoms therefore is 1:1 in the composition. However, Cu in the p-type oxide produced therefrom is monovalent, thus a ratio of the number of Cu atoms to the number of oxygen atoms is 2:1 in the p-type oxide. The composition has excess oxygen atoms relative to Cu atoms in producing the p-type oxide. Such composition results in the p-type oxide which has large amount of oxygen to thereby suppress production of electrons due to an oxygen defect. Therefore, the p-type oxide with high concentration of holes and exhibits excellent p-type electrical conductivity can be obtained.

(Semiconductor Device)

A semiconductor device of the present invention includes at least an active layer, and, if necessary, further includes other members.

<Active Layer>

The active layer is not particularly limited and may be appropriately selected depending on the intended purpose, so long as it contains the p-type oxide of the present invention.

As mentioned above, the p-type oxide of the present invention is suitably contained in the active layer of the semiconductor device because it can achieve desired properties depending on the intended purpose by adjusting its composition. That is, when the p-type oxide having optimized properties is contained in the active layer, the semiconductor device is improved in corresponding properties.

The shape, structure and size of the active layer are not particularly limited and may be appropriately selected depending on the intended purpose.

The semiconductor device includes a diode, a field effect transistor, a light-emitting device, and a photoelectric transducer.

<Diode>

The diode is not particularly limited and may be appropriately selected depending on the intended purpose. For example, a diode including a first electrode, a second electrode, and an active layer formed between the first electrode and the second electrode may be used. Examples of the diode include a p-n junction diode and a PIN photodiode.

There are many known materials having high transmittance for visible light among n-type oxide semiconductors. The p-type oxide of the present invention can also transmit the visible light due to its wide bandgap. Thus, the p-type oxide of the present invention can result in a transparent diode.

—p-n Junction Diode—

The p-n junction diode includes at least an active layer, and, if necessary, further includes other members such as an anode (positive electrode) and a cathode (negative electrode).

—Active Layer—

The active layer includes at least a p-type semiconductor layer and an n-type semiconductor layer and, if necessary, further includes other members.

The p-type semiconductor layer is in contact with the n-type semiconductor layer.

—p-Type Semiconductor Layer—

The p-type semiconductor layer is not particularly limited and may be appropriately selected depending on the intended purpose, so long as it contains the p-type oxide of the present invention.

The composition and producing conditions of the p-type oxide are preferably selected so that carrier concentration and carrier mobility required to serve as the active layer can be obtained.

The average thickness of the p-type semiconductor layer is not particularly limited and may be appropriately selected depending on the intended purpose, but is preferably 50 nm to 2,000 nm.

—n-Type Semiconductor Layer—

The material of the n-type semiconductor layer is not particularly limited and may be appropriately selected depending on the intended purpose, but is preferably a transparent n-type oxide semiconductor.

The transparent n-type oxide semiconductor is not particularly limited and may be appropriately selected depending on the intended purpose. Examples thereof include ZnO and IGZO (In—Ga—Zn—O).

In the case where the transparent n-type oxide semiconductor is used, the p-type oxide of the present invention can also transmit the visible light due to its wide bandgap, and thus a transparent active layer can be obtained.

A method for producing the n-type semiconductor layer is not particularly limited and may be appropriately selected depending on the intended purpose. Examples thereof include a vacuum process such as a sputtering method, a pulsed laser deposition (PLD) method, a CVD method, and an ALD method, a dip coating method, a printing method such as an inkjet printing method and a nano-imprinting method.

The average thickness of the n-type semiconductor layer is not particularly limited and may be appropriately selected depending on the intended purpose, but is preferably 50 nm to 2,000 nm.

When the p-type semiconductor layer and the n-type semiconductor layer are both composed of crystalline material, the following failure tends to occur: good crystals cannot be obtained due to a mismatch of crystal lattices upon lamination of the above semiconductor layers, and thus a semiconductor device which has excellent properties can not be achieved. In order to avoid the failure, materials between which crystal lattices are matched must be selected, which limits the type of materials used.

On the other hand, using the p-type oxide of the present invention for the p-type semiconductor layer prevents the foregoing failure even though the n-type semiconductor layer is crystalline. Accordingly, a good p-n junction interface can be formed. The p-type oxide of the present invention allows a wide range of n-type semiconductor materials to be used in the diode to thereby achieve excellent device properties.

—Anode (Positive Electrode)—

The anode is in contact with the p-type semiconductor layer.

The material of the anode is not particularly limited and may be appropriately selected depending on the intended purpose. Examples thereof include metals such as Mo, Al, Au, Ag, and Cu, and alloys thereof; transparent electric conductive oxides such as ITO and ATO; organic electric conductors such as polyethylenedioxythiophene (PEDOT) and polyaniline (PANI).

The shape, structure and size of the anode are not particularly limited and may be appropriately selected depending on the intended purpose.

The anode is provided so as to be in contact with the p-type semiconductor layer, and an ohmic contact is preferably formed therebetween.

A method for producing the anode is not particularly limited and may be appropriately selected depending on the intended purpose. Examples thereof include (i) a method in which a film is formed with, for example, a sputtering method or a dip coating method followed by patterning the film with a photolithography method; and (ii) a method in which a film having a desired shape is directly formed with printing methods such as an inkjet printing method, a nano-imprinting method, and a gravure printing method.

—Cathode (Negative Electrode)—

The material of the cathode is not particularly limited and may be appropriately selected depending on the intended purpose. For example, the material of the cathode may be the same as those mentioned for that of the anode.

The shape, structure and size of the cathode are not particularly limited and may be appropriately selected depending on the intended purpose.

The cathode is provided so as to be in contact with the n-type semiconductor layer, and an ohmic contact is preferably formed therebetween.

A method for producing the cathode is not particularly limited and may be appropriately selected depending on the intended purpose. For example, the method may be the same as those mentioned for that of the anode.

—Method for Producing p-n Junction Diode—

One exemplary method for producing the p-n junction diode shown in FIG. 1 now will be explained.

Firstly, a cathode 2 is laid over a base 1.

The shape, structure and size of the base are not particularly so limited and may be appropriately selected depending on the intended purpose.

The material of the base is not particularly limited and may be appropriately selected depending on the intended purpose. Examples of the base include a glass base and a plastic base.

The glass base is not particularly limited and may be appropriately selected depending on the intended purpose. Examples thereof include an alkali-free glass base and a silica glass base.

The plastic base is not particularly limited and may be appropriately selected depending on the intended purpose. Examples thereof include a polycarbonate (PC) base, a polyimide (PI) base, a polyethylene terephthalate (PET) base and a polyethylene naphthalate (PEN) base.

Notably, the base is preferably pre-treated through washing using oxygen plasma, UV ozone and UV irradiation from the viewpoints of cleaning the surface thereof and improving the adhesiveness of the surface.

Then, an n-type semiconductor layer 3 is laid over the cathode 2.

Then, a p-type semiconductor layer 4 is laid over the n-type semiconductor layer 3.

Then, an anode 5 is laid over the p-type semiconductor layer 4.

As described above, the p-n junction diode 6 is produced.

<Field Effect Transistor>

A field effect transistor includes at least a gate electrode, a source electrode, a drain electrode, an active layer and a gate insulating layer; and, if necessary, further includes other members.

—Gate Electrode—

The gate electrode is not particularly limited and may be appropriately selected depending on the intended purpose, so long as it is an electrode for applying gate voltage.

The material of the gate electrode is not particularly limited and may be appropriately selected depending on the intended purpose. Examples thereof include metals such as Mo, Al, Au, Ag, and Cu, and alloys thereof; transparent electric conductive oxides such as ITO and ATO; organic electric conductors such as polyethylenedioxythiophene (PEDOT) and polyaniline (PANI).

A method for producing the gate electrode is not particularly limited and may be appropriately selected depending on the intended purpose. Examples thereof include (i) a method in which a film is formed with, for example, a sputtering method or a dip coating method followed by patterning the film with a photolithography method; and (ii) a method in which a film having a desired shape is directly formed with printing methods such as an inkjet printing method, a nano-imprinting method, and a gravure printing method.

The average thickness of the gate electrode is not particularly limited and may be appropriately selected depending on the intended purpose. It is preferably 20 nm to 1 μm, more preferably 50 nm to 300 nm.

—Source Electrode and Drain Electrode—

The source electrode or the drain electrode is not particularly limited and may be appropriately selected depending on the intended purpose, so long as an electrode for extracting electric current from the field effect transistor.

The material of the source electrode or the drain electrode is not particularly limited and may be appropriately selected depending on the intended purpose. Examples thereof include materials which are the same as described above for the gate electrode.

High contact resistance between the active layer and the source electrode, or the active layer and the drain electrode leads to poor properties in a transistor. In order to avoid this problem, materials which results in low contact resistance are preferably selected as that of the source electrode and the drain electrode. Specifically, preferably selected are materials which have higher work function than the p-type oxide of the present invention contained in the active layer.

A method for producing the source electrode and the drain electrode is not particularly limited and may be appropriately selected depending on the intended purpose. For example, the method may be the same as those mentioned for that of the gate electrode.

The average thickness of the source electrode or the drain electrode is not particularly limited and may be appropriately selected depending on the intended purpose. It is preferably 20 nm to 1 μm, more preferably 50 nm to 300 nm.

—Active Layer—

The active layer contains the p-type oxide of the present invention.

The active layer is formed between the source electrode and the drain electrode. The phrase "between the source electrode and the drain electrode" as used herein means a position at which the active layer can make the field effect transistor to work in cooperation with the source electrode and the drain electrode. So long as the active layer is in such position, the position of the active layer is not particularly limited and may be appropriately selected depending on the intended purpose.

The composition and producing conditions of the p-type oxide are preferably selected so that carrier concentration and carrier mobility required to serve as the active layer can be obtained.

The average thickness of the active layer is not particularly limited and may be appropriately selected depending on the intended purpose. It is preferably 5 nm to 1 μm, more preferably 10 nm to 300 nm.

—Gate Insulating Layer—

The gate insulating layer is not particularly limited and may be appropriately selected depending on the intended purpose, so long as it is an insulating layer formed between the gate electrode and the active layer.

The material of the gate insulating layer is not particularly limited and may be appropriately selected depending on the intended so purpose. Examples thereof include materials widely utilized in a commercial production such as $SiO_2$ and SiNx; highly dielectric materials such as $La_2O_3$ and $HfO_2$; and organic materials such as polyimide (PI) and fluororesins.

A method for producing the gate insulating layer is not particularly limited and may be appropriately selected depending on the intended purpose. Examples thereof include a vacuum film formation method such as a sputtering method, a chemical vapor deposition (CVD) method, and an atomic layer deposition (ALD) method, a spin coating method, a die coating method, and a printing method such as an inkjet printing method.

The average thickness of the gate insulating layer is not particularly limited and may be appropriately selected depending on the intended purpose. It is preferably 50 nm to 3 μm, more preferably 100 nm to 1 μm.

Figure 4:
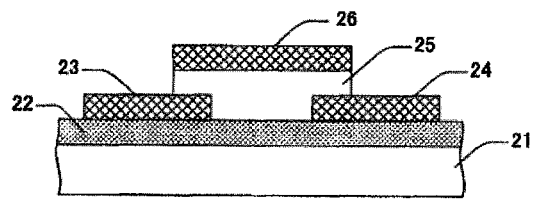
FIG. 4 is a schematic structural view of one exemplary field effect transistor of a top contact/top gate type.
Figure 5:
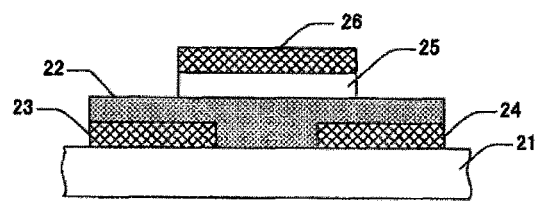
FIG. 5 is a schematic structural view of one exemplary field effect transistor of a bottom contact/top gate type.

The structure of the field effect transistor is not particularly limited and may be appropriately selected depending on the intended purpose. Examples thereof include a structure of a top contact/bottom gate type (FIG. 2), a structure of a bottom contact/bottom gate type (FIG. 3), a structure of a top contact/top gate type (FIG. 4) and a structure of a bottom contact/top gate type (FIG. 5).

In FIGS. 2 to 5, reference numeral 21 denotes a base, 22 denotes an active layer, 23 denotes a source electrode, 24 denotes a drain electrode, 25 denotes a gate insulating layer, and 26 denotes a gate electrode.

The field effect transistor is suitably used for the display device described below, but is not limited thereto. For example, the field effect transistor can be used for an IC card or an ID tag.

The field effect transistor uses the p-type oxide of the present invention in the active layer, which allows the composition of the p-type oxide to be widely adjusted. This results in the active layer which has preferable properties and thus improves the transistor properties. Additionally, the active layer is highly uniform due to being amorphous, which reduces unevenness of properties between individual transistors.

—Method for Producing Field Effect Transistor—

One exemplary method for producing the field effect transistor now will be explained.

Firstly, a gate electrode is laid over a base.

The shape, structure and size of the base are not particularly limited and may be appropriately selected depending on the intended purpose.

The material of the base is not particularly limited and may be appropriately selected depending on the intended purpose. Examples of the base include a glass base and a plastic base.

The glass base is not particularly limited and may be appropriately selected depending on the intended purpose. Examples thereof include an alkali-free glass base and a silica glass base.

The plastic base is not particularly limited and may be appropriately selected depending on the intended purpose. Examples thereof include a polycarbonate (PC) base, a polyimide (PI) base, a polyethylene terephthalate (PET) base and a polyethylene naphthalate (PEN) base.

Notably, the base is preferably pre-treated through washing using oxygen plasma, UV ozone and UV irradiation from the viewpoints of cleaning the surface thereof and improving the adhesiveness of the surface.

Then, the gate insulating layer is laid over the gate electrode.

Then, the active layer containing the p-type oxide, which is a channel region, is laid over the gate insulating layer.

Then, the source electrode and the drain electrode are laid over the gate insulating layer such that the source electrode and the drain electrode are spaced apart by the active layer.

Figure 2:
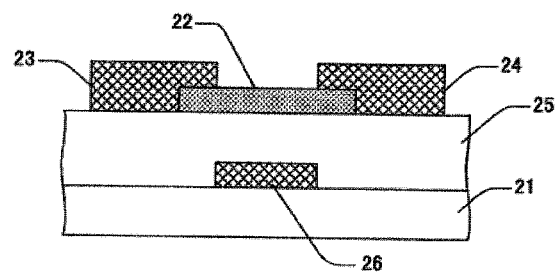
FIG. 2 is a schematic structural view of one exemplary field effect transistor of a top contact/bottom gate type.

As above, the field effect transistor is produced. In this method, a top contact/bottom gate type field effect transistor is produced, for example, as shown in FIG. 2.

The semiconductor device contains the p-type oxide of the present invention in the active layer. The p-type oxide can achieve desired properties depending on the intended purpose (electrical conductivity) by adjusting its composition. That is, when the p-type oxide having optimized properties is contained in the active layer, the semiconductor device can be improved in corresponding properties.

The field effect transistor as the semiconductor device of the present invention can result in a TFT having excellent properties. Additionally, the active layer is highly uniform due to being amorphous, which reduces unevenness of properties between individual transistors.

(Display Device)

The display device includes at least a light control device and a driving circuit which drives the light control device, and, if necessary, further includes other members.

<Light Control Device>

The light control device is not particularly limited, so long as it is a device which controls output of light based on driving signals, and may be appropriately selected depending on the intended purpose. Examples of the light control device include organic electroluminescence (EL) devices, electrochromic (EC) devices, liquid crystal devices, electrophoretic devices, and electrowetting devices.

<Driving Circuit>

The driving circuit is not particularly limited, so long as it has a semiconductor device of the present invention, and may be appropriately selected depending on the intended purpose.

<Other Members>

The other members are not particularly limited and may be appropriately selected depending on the intended purpose.

The display device of the present invention has the semiconductor device (e.g., the field effect transistor), which reduces unevenness between devices. In addition, the display device can operate a driving transistor at constant gate voltage even though the display device is subjected to a time-dependent change, which allows the device to be used for a long time.

(Image Display Apparatus)

An image display apparatus of the present invention includes at least a plurality of display devices, a plurality of wirings, and a display control apparatus, and, if necessary, further includes other members.

<Display Device>

The display device is not particularly limited and may be appropriately selected depending on the intended purpose, provided that it is the display device of the present invention arranged in a matrix form.

<Wiring>

The wiring is not particularly limited and may be appropriately selected depending on the intended purpose, provided that it can individually apply gate voltage and image data signal to each field effect transistor in the display device.

<Display Control Apparatus>

The display control apparatus is not particularly limited and may be appropriately selected depending on the intended purpose, provided that it can individually control the gate voltage and the signal voltage in each field effect transistor via the plurality of wirings based on image data.

<Other Members>

The other members are not particularly limited and may be appropriately selected depending on the intended purpose.

The image display apparatus of the present invention can stably operate for a long time because it includes the display device of the present invention.

The image display apparatus of the present invention can be used as a display unit in portable information apparatus such as cellular phones, portable music players, portable video players, electronic books and PDAs (Personal Digital Assistant), and imaging equipment such as still cameras and video cameras. It can also be used as a various information display unit in mobile systems such as motor vehicles, airplanes, trains, and ships. In addition, it can be used as a various information display unit in measuring apparatus, analyzing apparatus, medical devices, and advertising media.

(System)

The system of the present invention includes at least the image display apparatus of the present invention and an image data generation apparatus.

The image data generation apparatus generates image data based on image information to be displayed and outputs the image data to the image display apparatus.

The system of the present invention allows image data to be displayed with high definition because the system includes the image display apparatus.

The image display apparatus of the present invention now will be explained.

Figure 3:
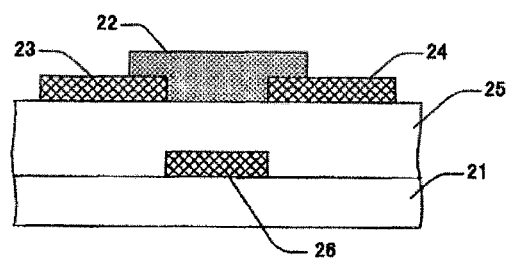
FIG. 3 is a schematic structural view of one exemplary field effect transistor of a bottom contact/bottom gate type.

The image display apparatus of the present invention may be those described in paragraphs [0059] and [0060], and shown in FIGS. 2 and 3 of JP-A No. 2010-074148.

Hereinafter, one exemplary embodiment of the present invention will be explained with reference to attached figures.

Figure 6:
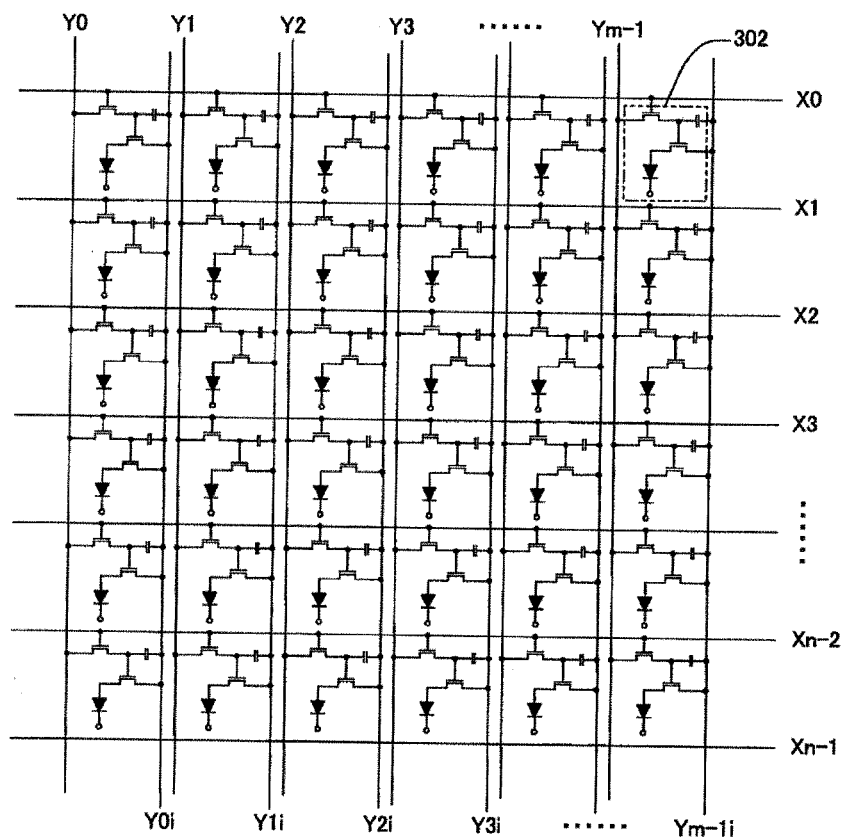
FIG. 6 is an explanatory view of an image display apparatus.
Figure 6:
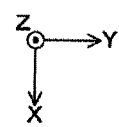

FIG. 6 is an explanatory view of a display in which the display devices are arranged in a matrix form.

The display has n scanning lines (X0, X1, X2, X3, ..., Xn−2, Xn−1) which arranged with equally spaced along a X-axis direction, m data lines (Y0, Y1, Y2, Y3, ..., Ym−1) which arranged with equally spaced along a Y-axis direction, and m current supply lines (Y0$i$, Y1$i$, Y2$i$, Y3$i$, ..., Ym−1$i$) which arranged with equally spaced along a Y-axis direction, as illustrated in FIG. 6.

Accordingly, the display device 302 can be identified by the scanning line number and the data line number.

Figure 7:
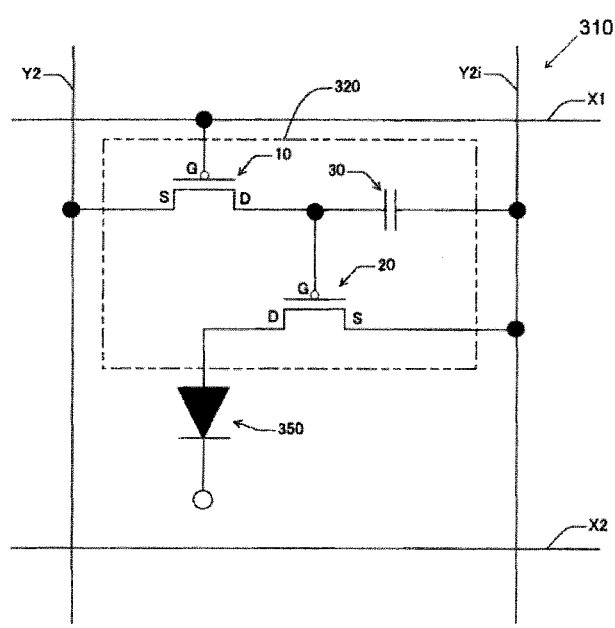
FIG. 7 is an explanatory view of one exemplary display device of the present invention.

FIG. 7 is a schematic structural view of one exemplary display device of the present invention.

The display device includes an organic EL (electroluminescence) device 350 and a drive circuit 320 which allows the organic EL device 350 to emit light as shown in, by way of example, FIG. 7. That is, a display 310 is so called an active-matrix organic electroluminescence display. The display 310 is an 81.28-cm (32-inch) color display. Notably, the size of the display 310 is not limited thereto.

A drive circuit 320 shown in FIG. 7 will be explained.

The drive circuit 320 includes two field effect transistors 10 and 20, and a capacitor 30.

A field effect transistor 10 is served as a switch device. A gate electrode G of the field effect transistor 10 is connected with a predetermined scanning line, and a source electrode S of the field effect transistor 10 is connected with a predetermined data line. A drain electrode D of the field effect transistor 10 is connected with one terminal of the capacitor 30.

A field effect transistor 20 supplies current to the organic EL device 350. A gate electrode G of the field effect transistor 20 is connected with the drain electrode D of the field effect transistor 10. A drain electrode D of the field effect transistor 20 is connected with the positive electrode of the organic EL device 350. A source electrode S of the field effect transistor 20 is connected with a predetermined current supply line.

The capacitor 30 stores a state of the field effect transistor 10, i.e., data. Other terminal of the capacitor 30 is connected with a predetermined current supply line.

Accordingly, when the field effect transistor 10 is switched on, image data is stored in the capacitor 30 via the Y2 line. Even after the field effect transistor 10 is switched off, the field effect transistor 20 which is held to "ON" state allows for the organic EL device 350 to be driven.

Figure 8:
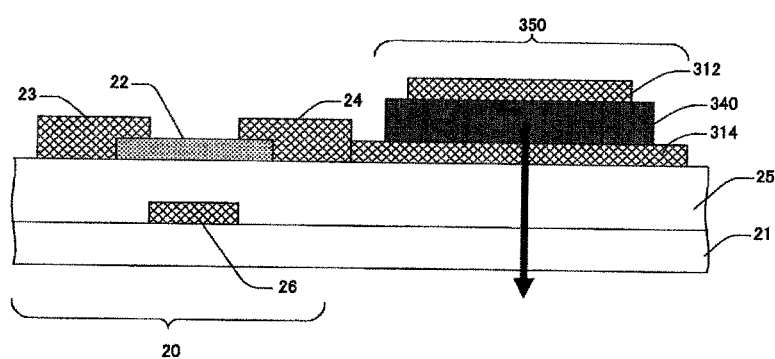
FIG. 8 is a schematic structural view of one exemplary positional relationship between an organic EL device and a field effect transistor in a display device, where the arrow indicates the direction in which light is emitted.

FIG. 8 illustrates one exemplary positional relationship between the organic EL device 350 and the field effect transistor 20, serving as a driving circuit, in the display device 302. In this figure, the organic EL device 350 is arranged laterally to the field effect transistor 20 on the same base. In addition, the field effect transistor and a capacitor (not shown) are also arranged on the same base.

Providing a protective layer over the active layer 22 is suitable, which is not shown in FIG. 8. For example, $SiO_2$, SiNx, $Al_2O_3$, or fluoropolymers may be appropriately used as material of the protective layer.

Figure 9:
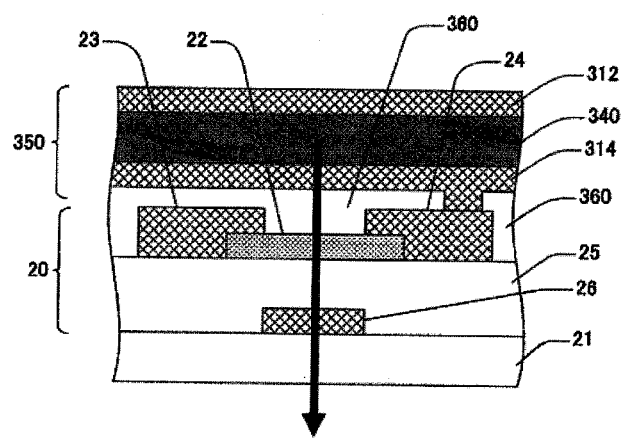
FIG. 9 is a schematic structural view of another exemplary positional relationship between an organic EL device and a field effect transistor in a display device, where the arrow indicates the direction in which light is emitted.

Alternatively, the organic EL device 350 may be laid over the field effect transistor 20 as shown in FIG. 9. In this case, the gate electrode 26 is required to be transparent, and therefore transparent electrical conductive oxides are used as the material of the gate electrode 26 such as ITO, $In_2O_3$, $SnO_2$, ZnO, Ga-containing ZnO, Al-containing ZnO and Sb-containing $SnO_2$. Notably, reference numeral 360 denotes an interlayer insulating film (planarized film). The material of the interlayer insulating film includes resins such as polyimide resins and acrylic resins.

Figure 10:
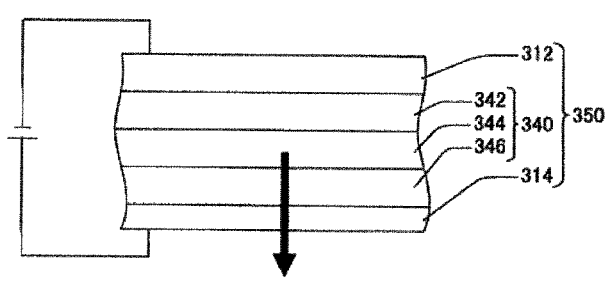
FIG. 10 is a schematic structural view of one exemplary organic EL device, where the arrow indicates the direction in which light is emitted.

FIG. 10 is a schematic view of one exemplary organic EL device.

In FIG. 10, the organic EL device 350 includes a negative electrode 312, a positive electrode 314, and an organic EL thin film layer 340.

The material of the negative electrode 312 is not particularly limited and may be appropriately selected depending on the intended purpose. Examples thereof include aluminum (Al), magnesium (Mg)-silver (Ag) alloy, aluminum (Al)-lithium (Li) alloy, and ITO (Indium Tin Oxide). Note that the magnesium (Mg)-silver (Ag) alloy results in a high-reflective electrode when the Mg—Ag alloy is sufficiently thick. Meanwhile, the Mg—Ag alloy results in a semi-transparent electrode when the Mg—Ag alloy is very thin (about less than 20 nm). In this figure, light is taken out from the positive electrode side, but light may be taken out from the negative electrode side when the negative electrode is transparent or semi-transparent.

The material of the positive electrode 314 is not particularly limited and may be appropriately selected depending on the intended purpose. Examples thereof include ITO (Indium Tin Oxide), IZO (Indium Zinc Oxide), and silver (Ag)-neodymium (Nd) alloy. Note that the silver alloy results in a high-reflective electrode, which is suitable when light is taken out from the negative electrode side.

The organic EL thin film layer 340 includes an electron transport layer 342, a light emitting layer 344, and a hole transport layer 346. The electron transport layer 342 is connected with the negative electrode 312, and the hole transport layer 346 is connected with positive electrode 314. When a predetermined voltage is applied between the positive electrode 314 and the negative electrode 312, the light emitting layer 344 emits light.

The electron transport layer 342 and the light emitting layer 344 together can be form one layer. An electron injection layer can be provided between the electron transport layer 342 and the negative electrode 312, and a hole injection layer can be further provided between the hole transport layer 346 and the positive electrode 314.

So called a "bottom emission" type organic EL device in which light is taken out from a side of a substrate has been described, but a "top emission" type organic EL device in which light is taken out from a side opposite to a substrate also can be used.

Figure 11:
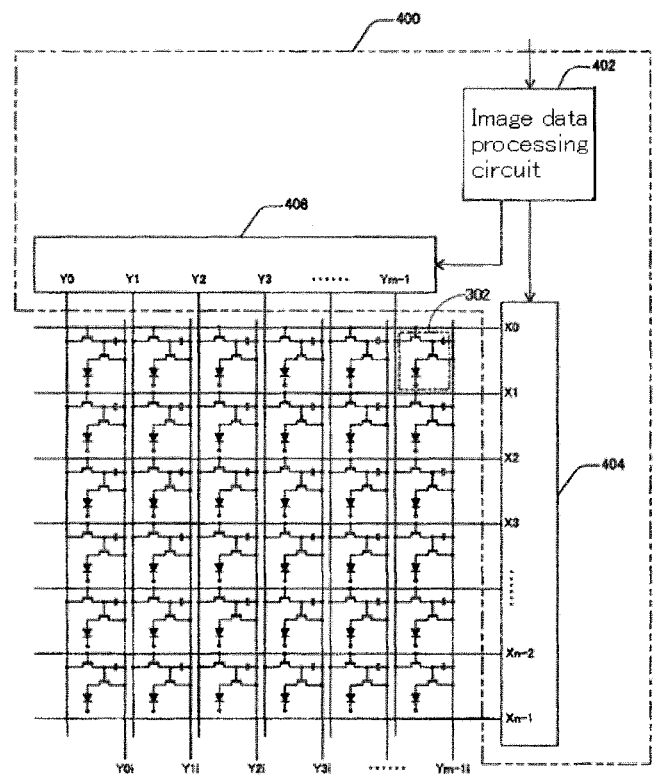
FIG. 11 is an explanatory view of a display control apparatus.

FIG. 11 is a schematic structural view of another exemplary image display apparatus of the present invention.

In FIG. 11, the image display apparatus includes a plurality of display devices 302, wirings (scanning lines, data lines, and power supply lines), and a display control apparatus 400.

The display control apparatus 400 includes an image data processing circuit 402, and a data line driving circuit 406.

The image data processing circuit 402 determines the brightness of each of the plurality of display devices 302 in the display based on a signal output from a video output circuit.

The scanning line driving circuit 404 individually applies voltage to the n scanning lines in response to an instruction from the image data processing circuit 402.

The data line driving circuit 406 individually applies voltage to the m data lines in response to an instruction from the image data processing circuit 402.

The embodiment in case where a light control device is an organic EL device has been described, but is not limited thereto. For example, the light control device may be an electrochromic device. In this case, the display is an electrochromic display.

Figure 12:
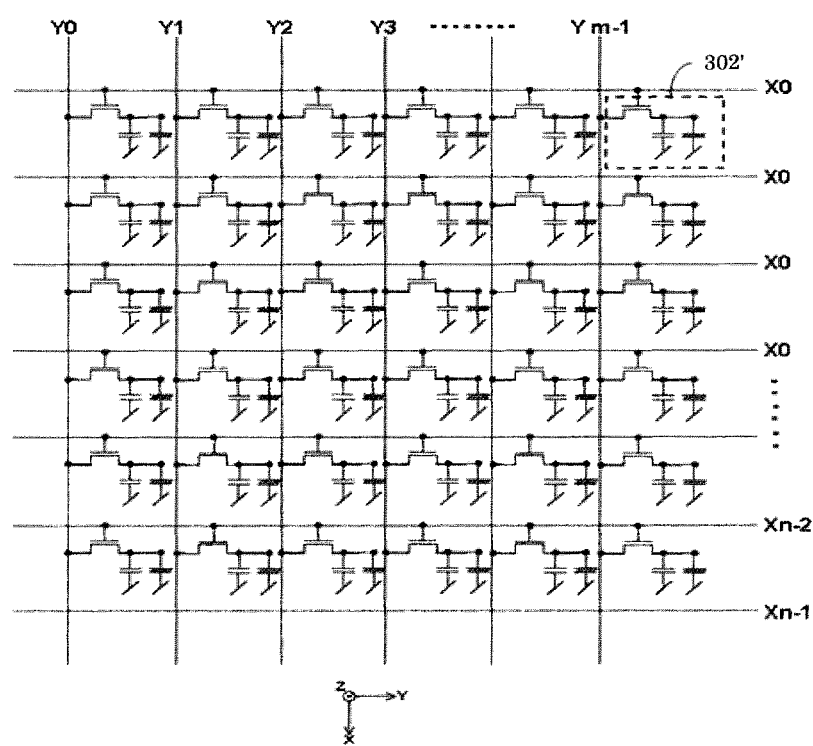
FIG. 12 is an explanatory view of a liquid crystal display, where Y0 . . . Ym−1 are data lines and X0 . . . Xn−1 are scanning lines.
Figure 13:
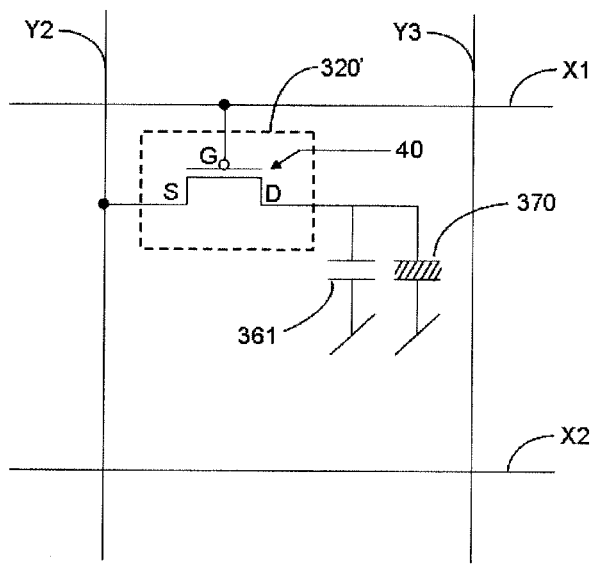
FIG. 13 is an explanatory view of a display device in FIG. 12.
Figure 14:
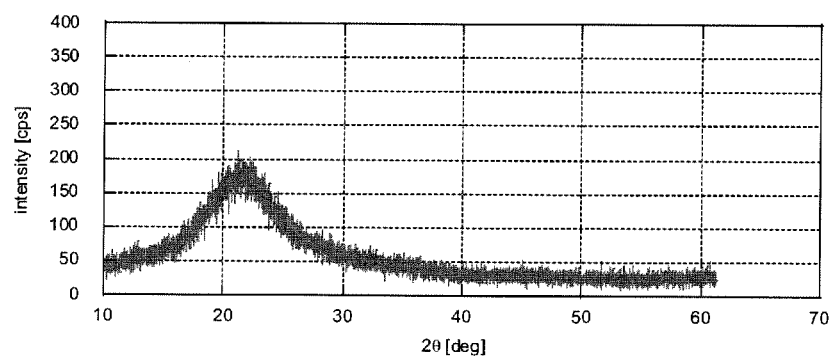
FIG. 14 illustrates the X-ray diffraction analysis result of the p-type oxide according to Example 1.
Figure 15:
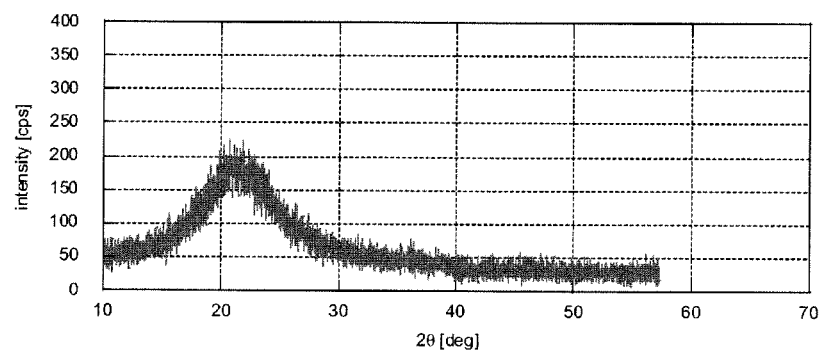
FIG. 15 illustrates the X-ray diffraction analysis result of the p-type oxide according to Example 3.
Figure 16:
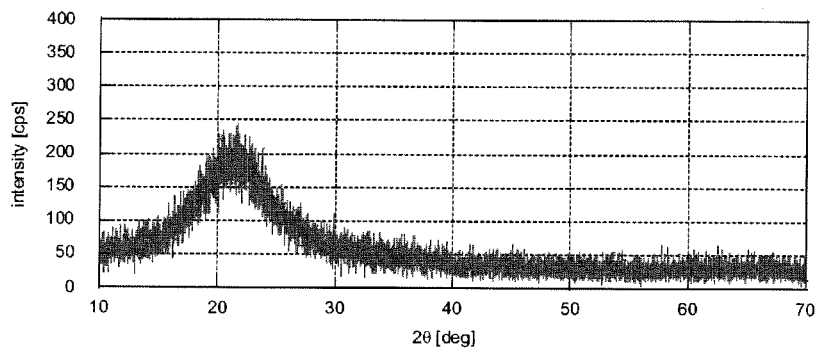
FIG. 16 illustrates the X-ray diffraction analysis result of the p-type oxide according to Example 7.
Figure 17:
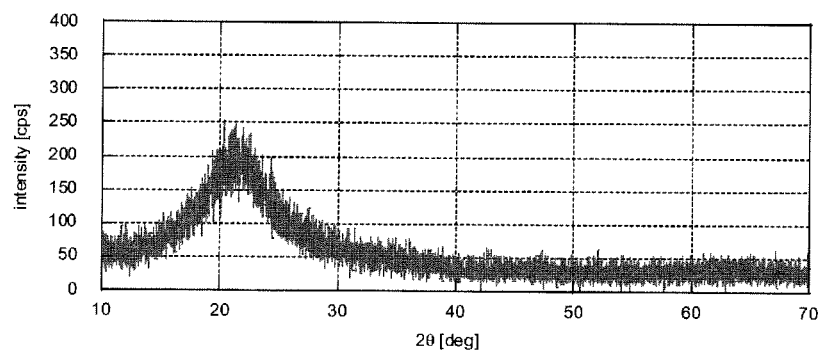
FIG. 17 illustrates the X-ray diffraction analysis result of the p-type oxide according to Example 9.
Figure 18:
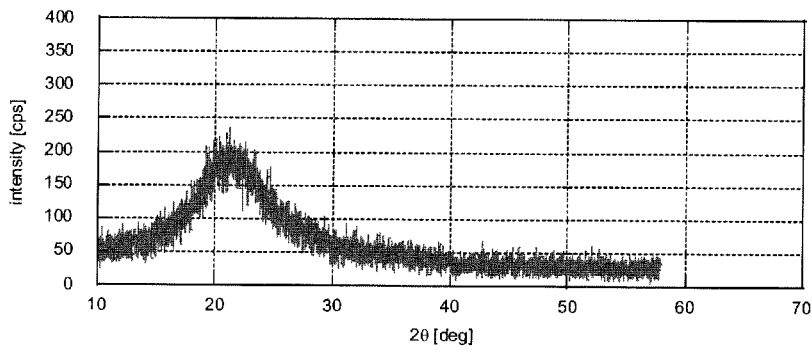
FIG. 18 illustrates the X-ray diffraction analysis result of the p-type oxide according to Example 12.
Figure 19:
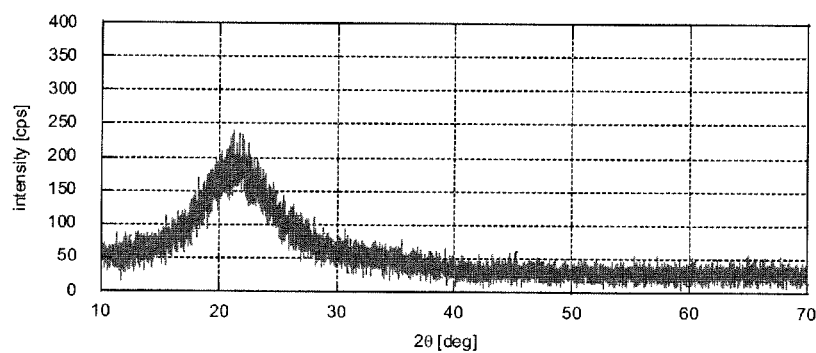
FIG. 19 illustrates the X-ray diffraction analysis result of the p-type oxide according to Example 14.
Figure 20:
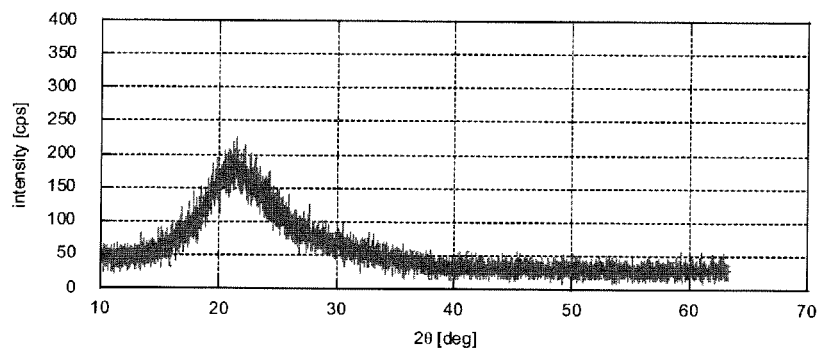
FIG. 20 illustrates the X-ray diffraction analysis result of the p-type oxide according to Example 15.
Figure 21:
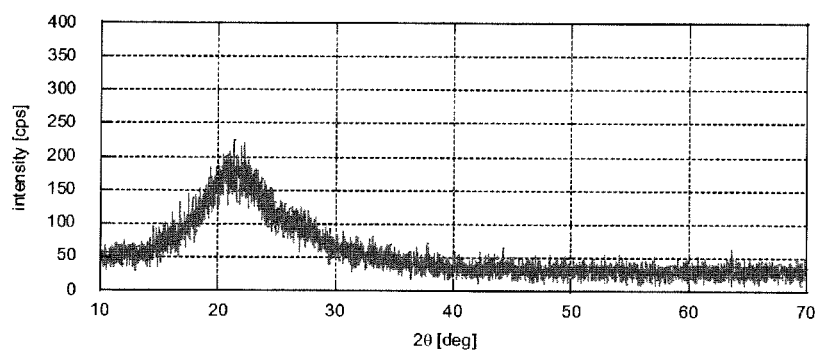
FIG. 21 illustrates the X-ray diffraction analysis result of the p-type oxide according to Example 18.
Figure 22:
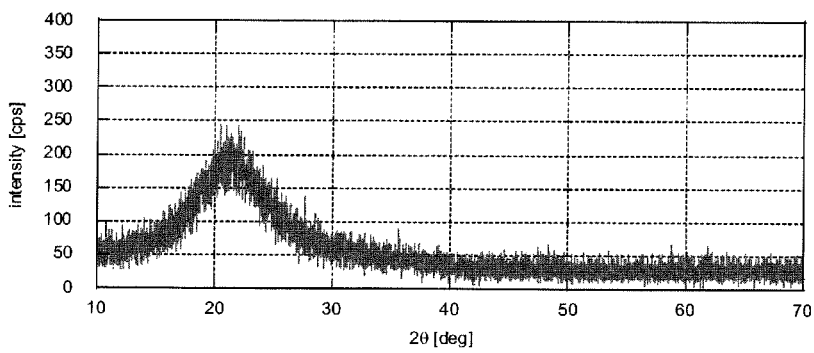
FIG. 22 illustrates the X-ray diffraction analysis result of the p-type oxide according to Example 24.
Figure 23:
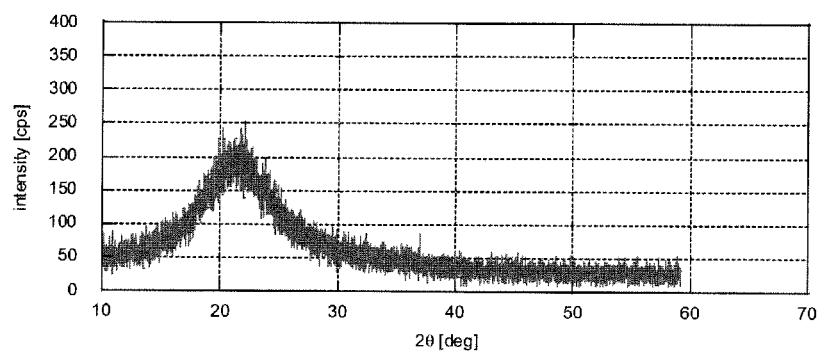
FIG. 23 illustrates the X-ray diffraction analysis result of the p-type oxide according to Example 27.
Figure 24:
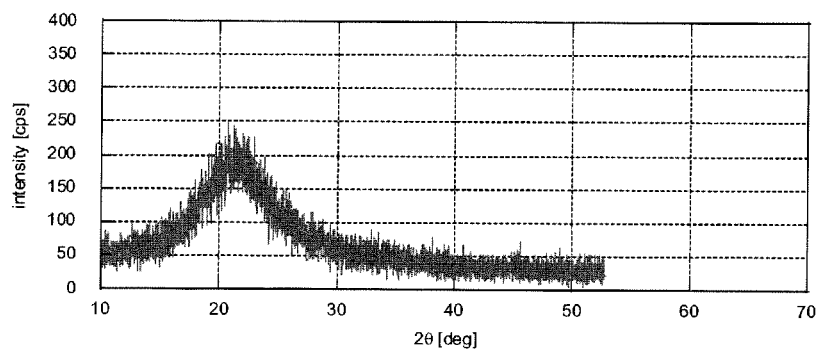
FIG. 24 illustrates the X-ray diffraction analysis result of the p-type oxide according to Example 30.
Figure 25:
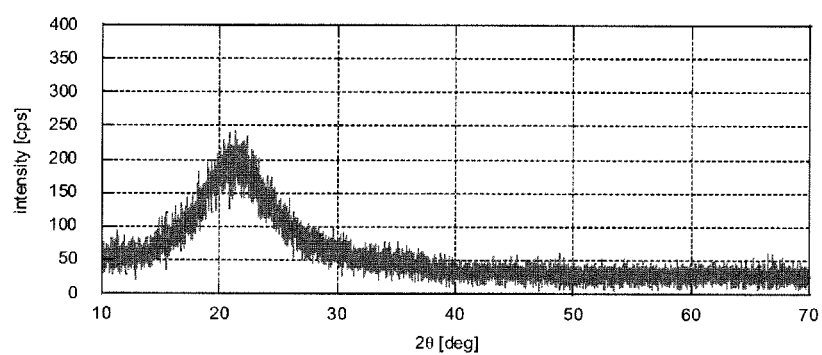
FIG. 25 illustrates the X-ray diffraction analysis result of the p-type oxide according to Example 32.
Figure 26:
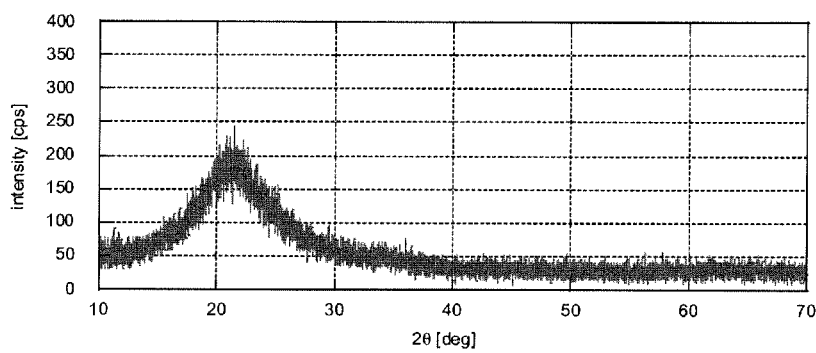
FIG. 26 illustrates the X-ray diffraction analysis result of the p-type oxide according to Example 35.
Figure 27:
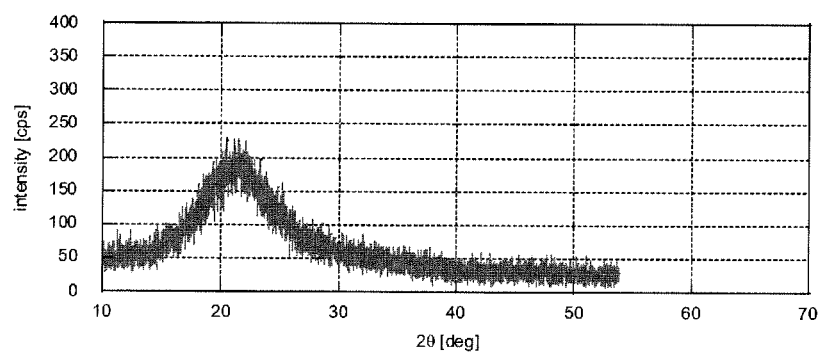
FIG. 27 illustrates the X-ray diffraction analysis result of the p-type oxide according to Example 38.
Figure 28:
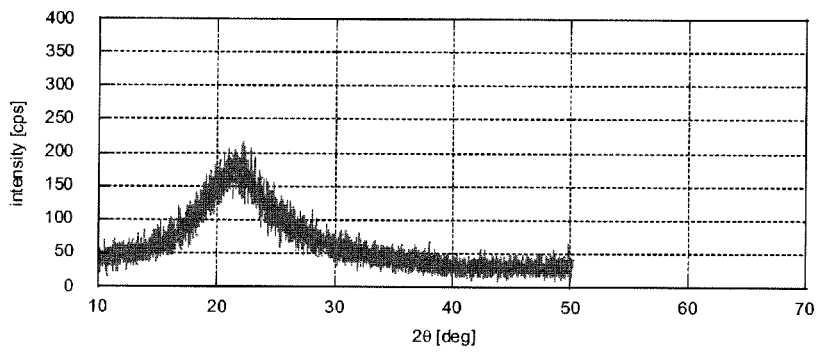
FIG. 28 illustrates the X-ray diffraction analysis result of the p-type oxide according to Example 40.
Figure 29:
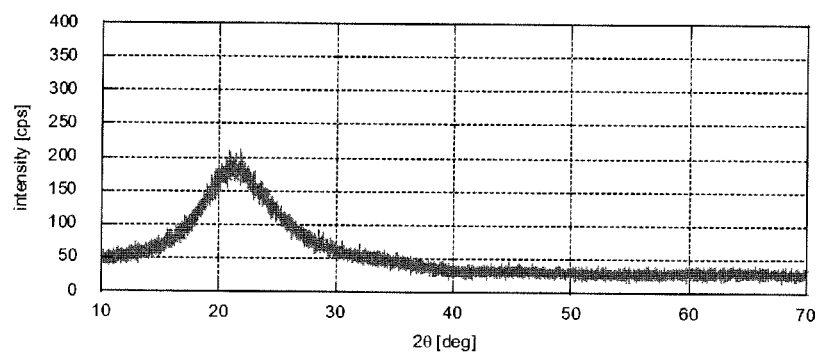
FIG. 29 illustrates the X-ray diffraction analysis result of the p-type oxide according to Example 43.
Figure 30:
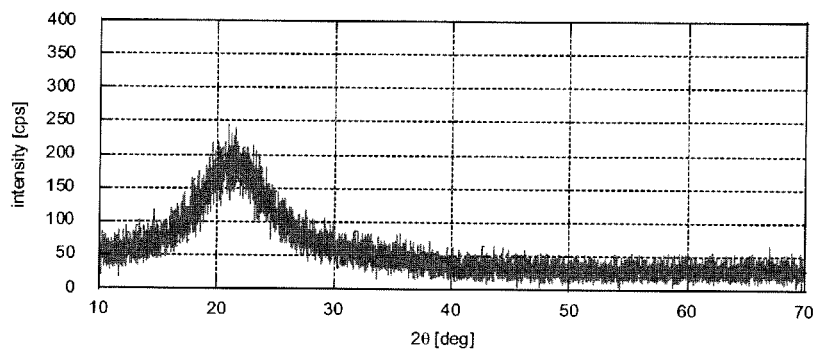
FIG. 30 illustrates the X-ray diffraction analysis result of the p-type oxide according to Example 45.
Figure 31:
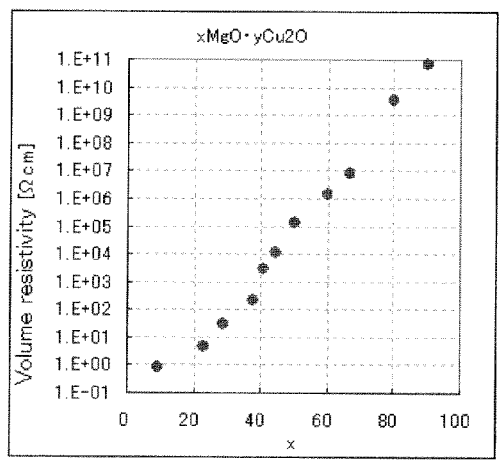
FIG. 31 illustrates the volume resistivity of the p-type oxides ($xMgO \cdot yCu_2O$) according to Examples 1 to 11.
Figure 32:
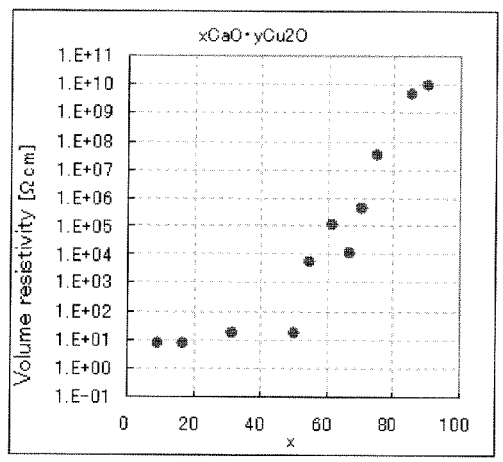
FIG. 32 illustrates the volume resistivity of the p-type oxides ($xCaO \cdot yCu_2O$) according to Examples 12 to 22.
Figure 33:
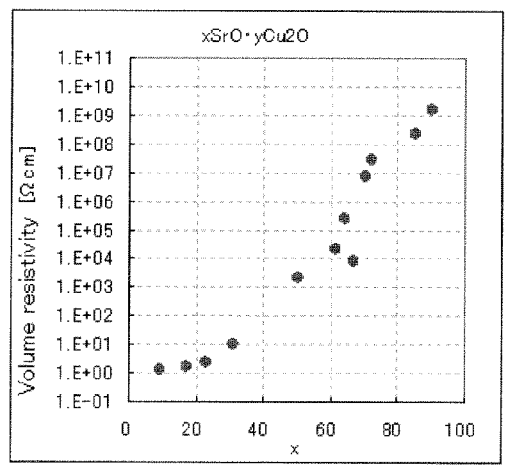
FIG. 33 illustrates the volume resistivity of the p-type oxides ($xSrO \cdot yCu_2O$) according to Examples 23 to 34.
Figure 34:
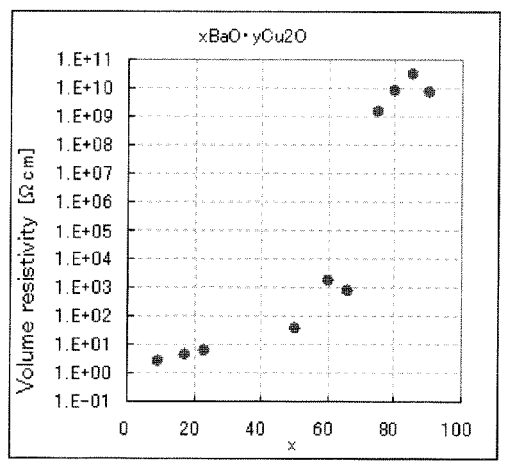
FIG. 34 illustrates the volume resistivity of the p-type oxides ($xBaO \cdot yCu_2O$) according to Examples 35 to 44.

Additionally, the light control device may be a liquid crystal device, in this case the display is a liquid crystal display, and no power supply line for the display device 302' is required to be used, illustrated in FIG. 12. As illustrated in FIG. 13, the drive circuit 320' can be constituted by a field effect transistor 40 which corresponds to the field effect transistors 10 and 20. In the field effect transistor 40, a gate electrode G is connected with a predetermined scanning line, and a source electrode S is connected with a predetermined data line. A drain electrode D is connected with a capacitor 361 and a pixel electrode of a liquid crystal device 370.

The light control device may be an electrophoresis device, an organic EL device or an electrowetting device.

The embodiment in case where a system of the present invention is a television apparatus has been described, but is not limited thereto. The system may be any system which has an image display apparatus as a device which displays image and information. For example, the system may be a computer system in which a computer, including a personal computer, is connected with an image display apparatus.

The system of the present invention can stably operate for a long time because it includes the image display apparatus of the present invention.

EXAMPLES

Examples of the present invention will be explained hereinafter, but these examples shall not be construed as limiting the scope of the present invention.

Examples 1 to 11

<Production of $xMgO \cdot yCu_2O$ Oxide Semiconductor (Amorphous)>

A solution of magnesium 2-ethylhexanoate (3.0% by mass) in toluene was mixed with a solution of copper neodecanoate (8.28% by mass) in toluene, followed by being diluted with toluene to obtain an ink for $xMgO \cdot yCu_2O$ oxide semiconductor. A ratio of the solution of magnesium 2-ethylhexanoate (3.0% by mass) in toluene to the solution of copper neodecanoate (8.28% by mass) in toluene was adjusted so that a molar ratio of Mg to Cu in the mixed solution would be x:2y.

Then, the ink for $xMgO \cdot yCu_2O$ oxide semiconductor was spin coated onto a glass base, dried for 1 hr at 120° C., and calcined for 3 hr at 250° C. while being irradiated with an excimer lamp (wavelength: 222 nm) under oxygen stream to form a $xMgO \cdot yCu_2O$ film.

Table 1 below summarizes each incorporated amount of the solution of magnesium 2-ethylhexanoate (3.0% by mass) in toluene and the solution of copper neodecanoate (8.28% by mass) in toluene, as well as values of "x" and "y," and the thickness of the resultant $xMgO \cdot yCu_2O$ oxide semiconductor.

TABLE 1

| | | | Solution of magnesium 2-ethylhexanoate (3.0% by mass) in toluene | | Solution of copper neodecanoate (8.28% by mass) in toluene | | | |
|---|---|---|---|---|---|---|---|---|
| | x | y | Incorporated amount [mL] | Mg amount in incorporated amount [mol] | Incorporated amount [mL] | Cu amount in incorporated amount [mol] | Thickness [nm] | Volume resistivity [Ωcm] |
| Ex. 1 | 9 | 91 | 0.0086 | 1.0E−05 | 0.154 | 2.0E−04 | 65.2 | 8.48E−01 |
| Ex. 2 | 23 | 77 | 0.0259 | 3.0E−05 | 0.154 | 2.0E−04 | 80.2 | 4.74E+00 |
| Ex. 3 | 29 | 71 | 0.0345 | 4.0E−05 | 0.154 | 2.0E−04 | 74.0 | 3.11E+01 |
| Ex. 4 | 38 | 62 | 0.0517 | 6.0E−05 | 0.154 | 2.0E−04 | 89.3 | 2.15E+02 |
| Ex. 5 | 41 | 59 | 0.0603 | 7.0E−05 | 0.154 | 2.0E−04 | 102.3 | 2.86E+03 |
| Ex. 6 | 44 | 56 | 0.0690 | 8.0E−05 | 0.154 | 2.0E−04 | 100.0 | 1.08E+04 |
| Ex. 7 | 50 | 50 | 0.0862 | 1.0E−04 | 0.154 | 2.0E−04 | 83.7 | 1.31E+05 |
| Ex. 8 | 60 | 40 | 0.129 | 1.5E−04 | 0.154 | 2.0E−04 | 73.8 | 1.40E+06 |
| Ex. 9 | 67 | 33 | 0.173 | 2.0E−04 | 0.154 | 2.0E−04 | 80.4 | 8.25E+06 |
| Ex. 10 | 80 | 20 | 0.345 | 4.0E−04 | 0.154 | 2.0E−04 | 106.4 | 3.56E+09 |
| Ex. 11 | 90 | 10 | 0.776 | 9.0E−04 | 0.154 | 2.0E−04 | 109.2 | 6.74E+10 |

In the above table, E denotes a "power of ten." For example, "1.0E−05" means "0.00001," and "1.0E+02" means "100."

Examples 12 to 22

<Production of $xCaO \cdot yCu_2O$ Oxide Semiconductor (Amorphous)>

A solution of calcium 2-ethylhexanoate (5.0% by mass) in mineral spirit was mixed with a solution of copper neodecanoate (8.28% by mass) in toluene, followed by being diluted with toluene to obtain an ink for $xCaO \cdot yCu_2O$ oxide semiconductor. A ratio of the solution of calcium 2-ethylhexanoate (5.0% by mass) in mineral spirit to the solution of copper neodecanoate (8.28% by mass) in toluene was adjusted so that a molar ratio of Ca to Cu in the mixed solution would be x:2y.

Then, the ink for $xCaO \cdot yCu_2O$ oxide semiconductor was spin coated onto a glass base, dried for 1 hr at 120° C., and calcined for 3 hr at 250° C. while being irradiated with an excimer lamp (wavelength: 222 nm) under oxygen stream to form a $xCaO \cdot yCu_2O$ film.

Table 2 below summarizes each incorporated amount of the solution of calcium 2-ethylhexanoate (5.0% by mass) in mineral spirit and the solution of copper neodecanoate (8.28% by mass) in toluene, as well as values of "x" and "y," and the thickness of the resultant $xCaO \cdot yCu_2O$ oxide semiconductor.

TABLE 2

|  | x | y | Solution of calcium 2-ethylhexanoate (5.0% by mass) in mineral spirit | | Solution of copper neodecanoate (8.28% by mass) in toluene | | Thickness [nm] | Volume resistivity [Ωcm] |
|---|---|---|---|---|---|---|---|---|
|  |  |  | Incorporated amount [mL] | Ca amount in incorporated amount [mol] | Incorporated amount [mL] | Cu amount in incorporated amount [mol] |  |  |
| Ex. 12 | 9 | 91 | 0.0080 | 1.0E−05 | 0.154 | 2.0E−04 | 63.7 | 7.35E+00 |
| Ex. 13 | 17 | 83 | 0.0160 | 2.0E−05 | 0.154 | 2.0E−04 | 66.0 | 7.93E+00 |
| Ex. 14 | 31 | 69 | 0.0365 | 4.6E−05 | 0.154 | 2.0E−04 | 66.9 | 1.77E+01 |
| Ex. 15 | 50 | 50 | 0.0802 | 1.0E−04 | 0.154 | 2.0E−04 | 75.0 | 1.74E+01 |
| Ex. 16 | 55 | 45 | 0.0962 | 1.2E−04 | 0.154 | 2.0E−04 | 90.0 | 5.81E+03 |
| Ex. 17 | 62 | 38 | 0.128 | 1.6E−04 | 0.154 | 2.0E−04 | 88.1 | 1.11E+05 |
| Ex. 18 | 67 | 33 | 0.160 | 2.0E−04 | 0.154 | 2.0E−04 | 108.8 | 1.22E+04 |
| Ex. 19 | 71 | 29 | 0.192 | 2.4E−04 | 0.154 | 2.0E−04 | 80.0 | 4.08E+05 |
| Ex. 20 | 75 | 25 | 0.240 | 3.0E−04 | 0.154 | 2.0E−04 | 88.8 | 3.22E+07 |
| Ex. 21 | 85 | 15 | 0.454 | 5.7E−04 | 0.154 | 2.0E−04 | 73.3 | 4.61E+09 |
| Ex. 22 | 90 | 10 | 0.721 | 9.0E−04 | 0.154 | 2.0E−04 | 66.0 | 9.18E+09 |

In the above table, E denotes a "power of ten." For example, "1.0E−05" means "0.00001," and "1.0E+02" means "100."

Examples 23 to 34

<Production of $xSrO \cdot Cu_2O$ Oxide Semiconductor (Amorphous)>

A solution of strontium 2-ethylhexanoate (2.0% by mass) in toluene was mixed with a solution of copper neodecanoate (8.28% by mass) in toluene, followed by being diluted with toluene to obtain an ink for $xSrO \cdot yCu_2O$ oxide semiconductor. A ratio of the solution of strontium 2-ethylhexanoate (2.0% by mass) in toluene to the solution of copper neodecanoate (8.28% by mass) in toluene was adjusted so that a molar ratio of Sr to Cu in the mixed solution would be x:2y.

Then, the ink for $xSrO \cdot yCu_2O$ oxide semiconductor was spin coated onto a glass base, dried for 1 hr at 120° C., and calcined for 3 hr at 250° C. while being irradiated with an excimer lamp (wavelength: 222 nm) under oxygen stream to form a $xSrO \cdot Cu_2O$ film.

Table 3 below summarizes each incorporated amount of the solution of strontium 2-ethylhexanoate (2.0% by mass) in toluene and the solution of copper neodecanoate (8.28% by mass) in toluene, as well as values of "x" and "y," and the thickness of the resultant $xSrO \cdot yCu_2O$ oxide semiconductor.

In the above table, E denotes a "power of ten." For example, "1.0E−05" means "0.00001," and "1.0E+02" means "100."

Examples 35 to 44

<Production of $xBaO \cdot yCu_2O$ Oxide Semiconductor (Amorphous)>

A solution of barium 2-ethylhexanoate (8.0% by mass) in toluene was mixed with a solution of copper neodecanoate (8.28% by mass) in toluene, followed by being diluted with toluene to obtain an ink for $xBaO \cdot yCu_2O$ oxide semiconductor. A ratio of the solution of barium 2-ethylhexanoate (8.0% by mass) in toluene to the solution of copper neodecanoate (8.28% by mass) in toluene was adjusted so that a molar ratio of Ba to Cu in the mixed solution would be x:2y.

Then, the ink for $xBaO \cdot yCu_2O$ oxide semiconductor was spin coated onto a glass base, dried for 1 hr at 120° C., and calcined for 3 hr at 250° C. while being irradiated with an excimer lamp (wavelength: 222 nm) under oxygen stream to form a $xBaO \cdot yCu_2O$ film.

Table 4 below summarizes each incorporated amount of the solution of barium 2-ethylhexanoate (8.0% by mass) in toluene and the solution of copper neodecanoate (8.28% by mass) in toluene, as well as values of "x" and "y," and the thickness of the resultant $xBaO \cdot yCu_2O$ oxide semiconductor.

TABLE 3

|  | x | y | Solution of strontium 2-ethylhexanoate (2.0% by mass) in toluene | | Solution of copper neodecanoate (8.28% by mass) in toluene | | Thickness [nm] | Volume resistivity [Ωcm] |
|---|---|---|---|---|---|---|---|---|
|  |  |  | Incorporated amount [mL] | Sr amount in incorporated amount [mol] | Incorporated amount [mL] | Cu amount in incorporated amount [mol] |  |  |
| Ex. 23 | 9 | 91 | 0.0438 | 1.00E−05 | 0.154 | 2.00E−04 | 80.3 | 1.26E+00 |
| Ex. 24 | 17 | 83 | 0.0876 | 2.00E−05 | 0.154 | 2.00E−04 | 73.2 | 1.57E+00 |
| Ex. 25 | 23 | 77 | 0.131 | 3.00E−05 | 0.154 | 2.00E−04 | 75.2 | 2.37E+00 |
| Ex. 26 | 31 | 69 | 0.199 | 4.60E−05 | 0.154 | 2.00E−04 | 70.7 | 1.05E+01 |
| Ex. 27 | 50 | 50 | 0.438 | 1.00E−04 | 0.154 | 2.00E−04 | 57.7 | 2.06E+03 |
| Ex. 28 | 62 | 38 | 0.701 | 1.60E−04 | 0.154 | 2.00E−04 | 95.3 | 2.24E+04 |
| Ex. 29 | 64 | 36 | 0.789 | 1.80E−04 | 0.154 | 2.00E−04 | 82.8 | 2.45E+05 |
| Ex. 30 | 67 | 33 | 0.876 | 2.00E−04 | 0.154 | 2.00E−04 | 57.3 | 7.88E+03 |
| Ex. 31 | 71 | 29 | 1.051 | 2.40E−04 | 0.154 | 2.00E−04 | 53 | 7.25E+06 |
| Ex. 32 | 72 | 28 | 1.139 | 2.60E−04 | 0.154 | 2.00E−04 | 51.1 | 2.80E+07 |
| Ex. 33 | 85 | 15 | 2.483 | 5.70E−04 | 0.154 | 2.00E−04 | 20.2 | 2.23E+08 |
| Ex. 34 | 90 | 10 | 3.943 | 9.00E−04 | 0.154 | 2.00E−04 | 17.3 | 1.55E+09 |

TABLE 4

| | x | y | Solution of barium 2-ethylhexanoate (8.0% by mass) in toluene | | Solution of copper neodecanoate (8.28% by mass) in toluene | | Thickness [nm] | Volume resistivity [Ωcm] |
|---|---|---|---|---|---|---|---|---|
| | | | Incorporated amount [mL] | Ba amount in incorporated amount [mol] | Incorporated amount [mL] | Cu amount in incorporated amount [mol] | | |
| Ex. 35 | 9 | 91 | 0.0172 | 1.0E−05 | 0.154 | 2.0E−04 | 63.1 | 2.72E+00 |
| Ex. 36 | 17 | 83 | 0.0343 | 2.0E−05 | 0.154 | 2.0E−04 | 73.3 | 4.29E+00 |
| Ex. 37 | 23 | 77 | 0.0687 | 4.0E−05 | 0.154 | 2.0E−04 | 83.5 | 5.80E+00 |
| Ex. 38 | 50 | 50 | 0.172 | 1.0E−04 | 0.154 | 2.0E−04 | 66.9 | 3.77E+01 |
| Ex. 39 | 60 | 40 | 0.257 | 1.5E−04 | 0.154 | 2.0E−04 | 76.6 | 1.70E+03 |
| Ex. 40 | 66 | 34 | 0.343 | 2.0E−04 | 0.154 | 2.0E−04 | 50.2 | 7.14E+02 |
| Ex. 41 | 75 | 25 | 0.515 | 3.0E−04 | 0.154 | 2.0E−04 | 69.8 | 1.42E+09 |
| Ex. 42 | 80 | 20 | 0.687 | 4.0E−04 | 0.154 | 2.0E−04 | 109.5 | 8.01E+09 |
| Ex. 43 | 85 | 15 | 0.973 | 5.7E−04 | 0.154 | 2.0E−04 | 102.8 | 2.86E+10 |
| Ex. 44 | 90 | 10 | 1.545 | 9.0E−04 | 0.154 | 2.0E−04 | 74.5 | 7.20E+09 |

In the above table, E denotes a "power of ten." For example, "1.0E−05" means "0.00001," and "1.0E+02" means "100."

Example 45

<Production of $Cu_2O$ Oxide Semiconductor (Amorphous)>

A solution of copper neodecanoate (8.28% by mass) in toluene was diluted with toluene to obtain an ink for $Cu_2O$ oxide semiconductor.

Then, the ink for $Cu_2O$ oxide semiconductor was spin coated onto a glass base, dried for 1 hr at 120° C., and calcined for 3 hr at 250° C. while being irradiated with an excimer lamp (wavelength: 222 nm) under oxygen stream to form a $Cu_2O$ film. Table 5 below shows the thickness of the resultant $Cu_2O$ oxide semiconductor.

TABLE 5

| | x | y | Thickness [nm] | Volume resistivity [Ωcm] |
|---|---|---|---|---|
| Ex. 45 | 0 | 100 | 80.4 | 1.07E+00 |

In the above table, E denotes a "power of ten." For example, "1.0E−05" means "0.00001," and "1.0E+02" means "100."

Examples 46 to 49

<Production of $xAO \cdot yCu_2O$ Oxide Semiconductor (Amorphous)>
(A=Two or More Elements Selected from Mg, Ca, Sr, and Ba)

A solution of magnesium 2-ethylhexanoate (3.0% by mass) in toluene, a solution of calcium 2-ethylhexanoate (5.0% by mass) in mineral spirit, a solution of strontium 2-ethylhexanoate (2.0% by mass) in toluene, and a solution of barium 2-ethylhexanoate (8.0% by mass) in toluene were mixed with a solution of copper neodecanoate (8.28% by mass) in toluene according to incorporated amounts indicated in Tables 6-1 and 6-2, followed by being diluted with toluene to obtain an ink for $xAO \cdot yCu_2O$ oxide semiconductor.

Then, the ink for $xAO \cdot yCu_2O$ oxide semiconductor was spin coated onto a glass base, dried for 1 hr at 120° C., and calcined for 3 hr at 250° C. while being irradiated with an excimer lamp (wavelength: 222 nm) under oxygen stream to form a $xAO \cdot yCu_2O$ film. In this $xAO \cdot yCu_2O$ film, A is composed of two or more elements selected from Mg, Ca, Sr, and Ba. Table 7 summarizes values of "x" and "y" calculated from the proportion by mole of Cu and the total proportion by mole of Mg, Ca, Sr, and Ba, as well as the percentage of each element constituting A which is calculated from the respective percentage of Mg, Ca, Sr, and Ba. Table 7 below also summarizes the thickness of the resultant $xAO \cdot yCu_2O$ oxide semiconductor.

TABLE 6-1

| | Solution of magnesium 2-ethylhexanoate (3.0% by mass) in toluene | | Solution of calcium 2-ethylhexanoate (5.0% by mass) in mineral spirit | | Solution of strontium 2-ethylhexanoate (2.0% by mass) in toluene | |
|---|---|---|---|---|---|---|
| | Incorporated amount [mL] | Mg amount in incorporated amount [mol] | Incorporated amount [mL] | Ca amount in incorporated amount [mol] | Incorporated amount [mL] | Sr amount in incorporated amount [mol] |
| Ex. 46 | 0 | 0 | 0.0044 | 5.5E−06 | 0.0096 | 2.2E−06 |
| Ex. 47 | 0.0200 | 2.3E−05 | 0 | 0 | 0 | 0 |
| Ex. 48 | 0.0100 | 1.2E−05 | 0.0055 | 6.8E−06 | 0.0118 | 2.7E−06 |
| Ex. 49 | 0 | 0 | 0.0109 | 1.4E−05 | 0.0237 | 5.4E−06 |

TABLE 6-2

| | Solution of barium 2-ethylhexanoate (8.0% by mass) in toluene | | Solution of copper neodecanoate (8.28% by mass) in toluene | |
|---|---|---|---|---|
| | Incorporated amount [mL] | Ba amount in incorporated amount [mol] | Incorporated amount [mL] | Cu amount in incorporated amount [mol] |
| Ex. 46 | 0.0031 | 1.8E−06 | 0.0391 | 5.1E−05 |
| Ex. 47 | 0.0077 | 4.5E−06 | 0.0687 | 9.0E−05 |
| Ex. 48 | 0.0038 | 2.2E−06 | 0.0490 | 6.4E−05 |
| Ex. 49 | 0 | 0 | 0.0292 | 3.8E−05 |

In the above table, E denotes a "power of ten." For example, "1.0E−05" means "0.00001," and "1.0E+02" means "100."

TABLE 7

| | Percentage of each element constituting A in $x$AO·$y$Cu$_2$O | | | | | | Thickness [nm] | Volume resistivity [Ωcm] |
|---|---|---|---|---|---|---|---|---|
| | x | y | Ca [%] | Mg [%] | Sr [%] | Ba [%] | | |
| Ex. 46 | 27 | 73 | 58 | 0 | 23 | 19 | 43.0 | 2.27E+01 |
| Ex. 47 | 38 | 62 | 0 | 84 | 0 | 16 | 64.0 | 7.24E+02 |
| Ex. 48 | 42 | 58 | 29 | 50 | 12 | 9 | 58.3 | 6.91E+02 |
| Ex. 49 | 50 | 50 | 72 | 0 | 28 | 0 | 87.3 | 1.09E+04 |

In the above table, E denotes a "power of ten." For example, "1.0E−05" means "0.00001," and "1.0E+02" means "100."

Comparative Example 1

<Production of Sr—Cu Oxide (Crystalline)>

An oxide film with the thickness of 100 nm was formed onto a glass base with a RF magnetron sputtering method using sintered SrCu$_2$O$_2$ (diameter: 10.16 cm (4 inch)) as a target. Argon gas and oxygen gas were used as a sputtering gas. The RF magnetron sputtering was performed with the following conditions: total pressure: 1.1 Pa, oxygen concentration: 80%, and RF power: 100 W. The temperature of the base was kept at 300° C. with a heater during film formation, and slowly cooled to room temperature with a speed of 2° C. per min after film formation.

Comparative Example 2

<Production of Sr—Cu Oxide (Crystalline)>

An oxide film with the thickness of 100 nm was formed onto a glass base in the same manner as Comparative Example 1, and then heated for 1 hr at 500° C. under nitrogen atmosphere.

(Evaluation)

<X-Ray Diffraction>

X-ray diffraction analyses (X'PertPro; product of Royal Philips Electronics) were performed for each of Examples. FIGS. 14 to 30 illustrate the X-ray diffraction analyses results of samples of Examples 1, 3, 7, 9, 12, 14, 15, 18, 24, 27, 30, 32, 35, 38, 40, 43, and 45, respectively.

In FIGS. 14 to 30, no diffraction peak was observed, which confirms that these oxide films were amorphous state. Similarly, no diffraction peak was observed in analyses performed for other Examples. Therefore, it is found that samples of all Examples were amorphous state.

In the X-ray diffraction analysis result for the sample of Comparative Example 1, a plurality of diffraction peaks were observed. Measurement of the diffraction angle (2θ) thereof confirmed that the oxide of Comparative Example 1 was SrCu$_2$O$_3$ crystals.

In the X-ray diffraction analysis result for the sample of Comparative Example 2, a diffraction peak was observed at the diffraction angle corresponding to Cu metal. From above result, it was found that the heat treatment reduced the Cu oxide to Cu metal.

<Thickness>

The thickness was determined with Spectral Film Thickness Monitor (FE-3000, product of Otsuka Electronics Co., Ltd.) by analyzing the reflection spectrum over a wavelength range of about 300 nm to about 700 nm.

<Volume Resistivity>

The volume resistivity was measured for oxide films produced in above Examples. The results are shown in Tables 1 to 5 and 7, and FIGS. 31 to 34. When the sample has the resistivity of 1×10$^3$ Ωcm or less, the volume resistivity was measured with the low resistivity meter LORESTA GP (product of Mitsubishi Chemical Analytech Co., Ltd.). Meanwhile, when the sample has the resistivity of more than 1×10$^3$ Ωcm, the volume resistivity was calculated from the I-V characteristic between a pair of electrodes which are line-shaped Au electrodes formed on the oxide film.

As seen from Tables 1 to 5 and 7, and FIGS. 31 to 34, all samples of above Examples exhibited electrical conductivity. In addition, it was found that the volume resistivity tends to increase as the value of x increases, and the volume resistivity varied over a very wide range from about 1 Ωcm to about 10$^{11}$ Ωcm.

The p-type oxide film of the present invention can be used for various semiconductor devices, but a property which semiconductors in the devices require (that is, resistivity) generally varies depending on the type and property of the semiconductor devices. Accordingly, the value of x may be appropriately selected depending on the intended purpose, provided that when the volume resistivity of the oxide film is more than 10$^8$ Ωcm, an ohmic contact cannot easily formed upon connection with an electrode, which is not practically preferred. In order for the volume resistivity to be 10$^8$ Ωcm or less, in the case of xMgO.yCu$_2$O, x is preferably less than 80. In the case of xCaO.yCu$_2$O, x is preferably less than 85. In the case of xSrO.yCu$_2$O, x is preferably less than 85. In the case of xBaO.yCu$_2$O, x is preferably less than 75.

The I-V characteristic was also determined for samples of Comparative Examples 1 and 2 in the same manner as Examples. That is, a pair of electrodes which are line-shaped Au electrodes were formed on the oxide film, and then the I-V characteristic between the electrodes was measured. The SrCu$_2$O$_3$ crystals of Comparative Example 1 were found not to exhibit linear I-V characteristic and to have the volume resistivity of 10$^{12}$ Ωcm or more. This result suggests that p-type electrical conductivity was not exhibited because Cu was divalent in the SrCu$_2$O$_3$ crystals. The volume resistivity of the sample of Comparative Example 2 was found to be 3×10$^7$ Ωcm. This suggests that the heat treatment decreased the resistivity. In fact, the decrease was due to production of Cu metal. That is, p-type electrical conductivity could not be controlled in the crystalline Sr—Cu oxide.

Example 50

<Production of p-n Junction Diode>

—Preparation of Base—

A non-alkali glass base (thickness: 0.7 mm) was used as a base. The glass base was ultrasonic cleaned with a neutral detergent, purified water, and isopropyl alcohol. After drying, the base was further treated with UV-ozone for 10 min at 90° C.

—Formation of Cathode Electrode—

A cathode electrode was formed by depositing Al through a metal mask onto the glass base so as to be 100 nm in thick.

—Formation of n-Type Semiconductor Layer—

An Mg—In based oxide film was formed with a high frequency sputtering method through a metal mask onto the cathode electrode. As a target, sintered polycrystals of which composition was $In_2MgO_4$ (diameter: 10.16 cm (4 inch)) were used. The ultimate vacuum within a sputtering chamber was $2\times10^{-5}$ Pa. The flow rates of argon gas and so oxygen gas upon sputtering were adjusted so that the total pressure was 1.0 Pa and the oxygen partial pressure was $6.0\times10^{-2}$ Pa. The temperature of the base was not controlled during sputtering. An Mg—In based oxide film having the thickness of 160 nm was formed with the sputtering power of 150 W and the sputtering time of 15 min.

—Formation of p-Type Semiconductor Layer—

A $41MgO.59Cu_2O$ film having the thickness of 109 nm was formed onto the n-type semiconductor layer in the same manner as Example 5.

—Formation of Anode Electrode—

An anode electrode was formed by depositing Al through a metal mask onto the p-type semiconductor layer so as to be 100 nm-thick.

As above, a p-n junction diode was produced.

<Evaluation>

Figure 35:
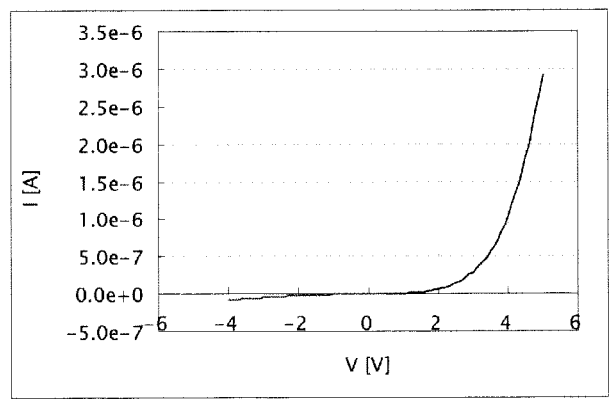
FIG. 35 illustrates the I-V characteristic of the diode produced in Example 50.

A diode of Example 50 was determined for the I-V characteristic. The result is shown in FIG. 35. Typical rectification curve was observed. That is, it is found that the p-n junction diode could be obtained using the p-type oxide of the present invention as the active layer.

Example 51

<Production of Field Effect Transistor>

—Preparation of Base (Gate Electrode, Gate Insulating Layer)—

A Si base with thermal oxide film (thickness: 200 nm) was used as a base. The Si base was ultrasonic cleaned with a neutral detergent, purified water, and isopropyl alcohol. After drying, the base was further treated with UV-ozone for 10 min at 90° C. In this case, the thermal oxide film served as a gate insulating layer, and the Si base served as a gate electrode.

—Formation of Active Layer—

The ink for $9MgO.91Cu_2O$ oxide semiconductor prepared in Example 1 was spin coated onto the Si base, dried for 1 hr at 120° C., and calcined for 3 hr at 250° C. while being irradiated with an excimer lamp (wavelength: 222 nm) under oxygen stream to form a $9MgO.91Cu_2O$ film having the average thickness of 71 nm.

After that, an active layer was formed by applying a photoresist to the film, followed by prebaking, exposing with an exposure apparatus, and developing the resultant film coated with the photoresist to form a resist pattern corresponding to that of the active layer to be formed. In addition, the $9MgO.91Cu_2O$ film existing in an area where the resist pattern was not formed was removed by a wet etching process, and then the resist pattern was also removed to form the active layer.

—Formation of Source Electrode and Drain Electrode—

A source electrode and drain electrode were formed by depositing 1 nm-thick Cr and 100 nm-thick Al in this order through a metal mask onto the active layer. The length and width of a channel were 50 μm and 0.4 mm, respectively.

Finally, the resultant source electrode and drain electrode were annealed for 1 hr at 300° C. under oxygen stream to obtain a field effect transistor.

<Evaluation>

The field effect transistor produced in Example 51 was determined for the transfer characteristic (Vds=−20 V) and found to be a normally off-type field effect transistor which exhibits excellent p-type transistor property.

Comparative Example 3

<Production of Field Effect Transistor>

A field effect transistor was produced in the same manner as Example 51 except that an active layer was formed as follows:

—Formation of Active Layer—

A crystalline $SrCu_2O_3$ film having the average thickness of 65 nm was formed in the same manner as Comparative Example 1.

After that, the active layer was formed by applying a photoresist to the film, followed by prebaking, exposing with an exposure apparatus, and developing the resultant film coated with the photoresist to form a resist pattern corresponding to that of the active layer to be formed. In addition, the $SrCu_2O_3$ film existing in an area where the resist pattern was not formed was removed by a wet etching process, and then the resist pattern was also removed to form the active layer.

<Evaluation>

The field effect transistor of Comparative Example 3 was determined for the transfer characteristic (Vds=−20 V) and found that the active layer has too high resistance to exhibit the transistor characteristic.

Example 52

<Production of Field Effect Transistor>

—Preparation of Base (Gate Electrode, Gate Insulating Layer)—

A Si base with thermal oxide film (thickness: 200 mm) was used as a base. The Si base was ultrasonic cleaned with a neutral detergent, purified water, and isopropyl alcohol. After drying, the base was further treated with UV-ozone for 10 min at 90° C. In this case, the thermal oxide film served as a gate insulating layer, and the Si base served as a gate electrode.

—Formation of Source Electrode and Drain Electrode—

HMDS (hexamethyldisilazane) was spin coated onto the Si base with thermal oxide film and dried. The resultant base surface was subjected to a hydrophobization. Then, for a lift-off process, an underlying resist layer was formed through a spin coating and drying process. In addition, a photosensitive photoresist layer was formed over the underlying resist layer through a spin coating and drying process. The resultant laminate was patterned by exposing through a photomask and developing prior to forming a layer made of electrode material, Pt, with a DC sputtering method onto the laminate. As a target, Pt (diameter: 10.16 cm (4 inch)) was used. The ultimate vacuum within a sputtering chamber was $1\times10^{-3}$ Pa. Upon sputtering, the pressure was adjusted to 0.35 Pa using argon gas stream. The temperature of the base was not controlled during sputtering. A Pt film having the thickness of 50 nm was formed with the sputtering power of DC 200 W and the sputtering time of 6 min and 15 sec.

Then, the base with the Pt film was immersed into N-methylpyrrolidone to remove unwanted areas of the Pt film together with the resist to thereby obtain a Pt source electrode and a Pt drain electrode both having desired shapes.

—Preparation of Semiconductor Ink for Inkjet Printing—

Copper nitrate trihydrate (2.42 g, equivalent to 10 mmol) was dissolved in 2-methoxyethanol (10 mL) to produce a copper raw solution. Magnesium nitrate hexahydrate (2.56 g, equivalent to 10 mmol) was dissolved in 2-methoxyethanol (10 mL) to produce a magnesium raw solution.

Ethylene glycol (24 mL) was mixed with 2-methoxyethanol (12 mL), the copper raw solution (10 mL), and the magnesium raw solution (2 mL), and the resultant mixture was stirred to produce a semiconductor ink for inkjet printing. The molar ratio of Cu to Mg in the ink was 5:1. This ink had a composition of $29MgO.71Cu_2O$, and therefore are referred to as "$29MgO.71Cu_2O$ semiconductor ink."

—Formation of Active Layer—

The $29MgO.71Cu_2O$ semiconductor ink was applied with an inkjet printing apparatus onto desired areas on the base where the source and drain electrodes have been formed thereon. The resultant base coated with the ink was dried for 1 hr at 120° C., and calcined for 3 hr at 250° C. while being irradiated with an excimer lamp (wavelength: 222 nm) to form a $29MgO.71Cu_2O$ film having the thickness of 44 nm.

Finally, the resultant was annealed for 1 hr at 300° C. to obtain a field effect transistor.

Figure 36:
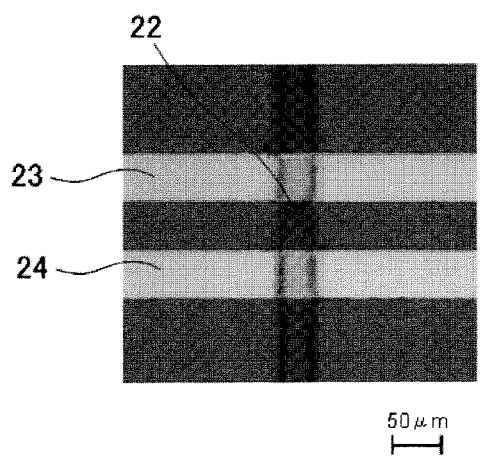
FIG. 36 is the microphotograph of the channel portion of the field effect transistor produced in Example 52.

FIG. 36 is the microphotograph of the channel portion of the field effect transistor. The distance between the source electrode 23 and the drain electrode 24 is referred to as the channel length, which is 50 μm in this case. The channel width is defined by the width of the active layer 22 which is applied in a vertical line. In this microphotograph, the field effect transistor has the channel width of 36 μm.

<Evaluation>

At first, in order to evaluate the resistivity of the resultant $29MgO.71Cu_2O$ semiconductor film, the current value between the source electrode and the drain electrode was measured under the following conditions: 1) no voltage was applied to the gate electrode; 2) a voltage of 20 V was applied to the source electrode; and 3) the drain electrode was grounded. The current value was found to be 2.85 μA. The volume resistivity of the $29MgO.71Cu_2O$ semiconductor film was calculated from the above current value to be 22.2 Ωcm. On the other hand, the volume resistivity of the $29MgO.71Cu_2O$ semiconductor film of Example 3 was calculated to be 31.1 Ωcm. The finished $29MgO.71Cu_2O$ semiconductor film of Examples 3 were confirmed to have similar resistivity to that of Example 52 regardless of the type of raw material of the ink (the solvent, the Cu-containing compound and the Mg-containing compound) and the ink application method.

Next, the field effect transistor of Example 52 was determined for the transfer characteristic (Vds=−20 V) and found to be a normally so off-type transistor which exhibits excellent p-type transistor property. In Example 51, the $9MgO.91Cu_2O$ semiconductor film was formed through a spin coat process prior to be made into a desired shape with a wet-etching process. Meanwhile, in Example 52, the $29MgO.71Cu_2O$ semiconductor film was formed on only desired areas with an inkjet printing method, which eliminated a subsequent patterning step to thereby allow a field effect transistor to be produced more easily.

INDUSTRIAL APPLICABILITY

The p-type oxide of the present invention can exhibit excellent property, that is sufficient electrical conductivity, can be produced at relatively low-temperature and under practical conditions, and can be controlled in electrical conductivity by adjusting its composition ratio. Therefore, the p-type oxide can be suitably used for an active layer of a semiconductor device such as a diode and a field effect transistor.

REFERENCE SIGNS LIST 1 base
2 cathode
3 n-type semiconductor layer
4 p-type semiconductor layer
5 anode
6 p-n junction diode
10 field effect transistor
20 field effect transistor
21 base
22 active layer
23 source electrode
24 drain electrode
25 gate insulating layer
26 gate electrode
30 capacitor
40 field effect transistor
302, 302' display device
310 display
312 negative electrode
314 positive electrode
320, 320' drive circuit
340 organic EL thin film layer
342 electron transport layer
344 light-emitting layer
346 hole transport layer
350 organic EL device
360 interlayer insulating film
361 capacitor
370 liquid crystal device
400 display control apparatus
402 image data processing circuit
404 scanning line driving circuit
406 data line driving circuit

The invention claimed is:

1. A p-type oxide, wherein the p-type oxide is amorphous and is represented by the following compositional formula:

$$xAO.yCu_2O$$

where x denotes a proportion by mole of AO and y denotes a proportion by mole of $Cu_2O$, and A is any one of Mg, Ca, Sr and Ba, or a mixture containing at least two selected from the group consisting of Mg, Ca, Sr and Ba, and wherein in a case that A is any one of Mg, Ca and Ba or a mixture containing at least two selected from the group consisting of Mg, Ca, Sr and Ba, x and y satisfy each of the following expressions (i) and (ii):

$$0 \leq x < 100; \text{ and} \qquad (i)$$

$$x+y=100, \qquad (ii)$$

in a case that A is Sr only, x and y satisfy each of the following expressions (iii) and (iv):

$$\text{either } 0 \leq x < 50 \text{ or } 50 < x < 100; \text{ and} \qquad (iii)$$

$$x+y=100 \qquad (iv).$$

2. A semiconductor device comprising:
an active layer, wherein the active layer comprises a p-type oxide,
wherein the p-type oxide contained in the active layer is amorphous and is represented by the following compositional formula:

$x\mathrm{AO}.y\mathrm{Cu}_2\mathrm{O}$ where x denotes a proportion by mole of AO and y denotes a proportion by mole of $\mathrm{Cu}_2\mathrm{O}$, and A is any one of Mg, Ca, Sr and Ba, or a mixture containing at least two selected from the group consisting of Mg, Ca, Sr and Ba, and wherein
in a case that A is any one of Mg, Ca and Ba or a mixture containing at least two selected from the group consisting of Mg, Ca, Sr and Ba, x and y satisfy each of the following expressions (i) and (ii):

$0 \leq x < 100$; and  (i)

$x+y=100$,  (ii)

and in a case that A is Sr only, x and y satisfy each of the following expressions (iii) and (iv):

either $0 \leq x < 50$ or $50 < x < 100$; and  (iii)

$x+y=100$  (iv).

3. The semiconductor device according to claim 2, further comprising:
a first electrode; and
a second electrode,
wherein the semiconductor device is a diode where the active layer is formed between the first electrode and the second electrode.

4. The semiconductor device according to claim 2, further comprising:
a gate electrode configured to apply gate voltage;
a source electrode and a drain electrode which are configured to extract electric current; and
a gate insulating layer,
wherein the semiconductor device is a field effect transistor where the active layer is formed between the source electrode and the drain electrode, and the gate insulating layer is formed between the gate electrode and the active layer.

* * * * *